US011474437B2

(12) United States Patent
Kapoano et al.

(10) Patent No.: US 11,474,437 B2
(45) Date of Patent: Oct. 18, 2022

(54) INCREASING SIGNAL-TO-NOISE RATIO IN OPTICAL IMAGING OF DEFECTS ON UNPATTERNED WAFERS

(71) Applicant: APPLIED MATERIALS ISRAEL LTD., Rehovot (IL)

(72) Inventors: Yechiel Kapoano, Omer (IL); Binyamin Kirshner, Elkana (IL); David Goldovsky, Dolev (IL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 317 days.

(21) Appl. No.: 16/861,094

(22) Filed: Apr. 28, 2020

(65) Prior Publication Data

US 2021/0333719 A1  Oct. 28, 2021

(51) Int. Cl.
| | | |
|---|---|---|
| G03F 7/20 | (2006.01) | |
| G01N 21/88 | (2006.01) | |
| G01N 21/956 | (2006.01) | |
| G01N 21/95 | (2006.01) | |
| G03F 1/84 | (2012.01) | |
| F21V 8/00 | (2006.01) | |

(52) U.S. Cl.
CPC ....... *G03F 7/7065* (2013.01); *G01N 21/8806* (2013.01); *G01N 21/8851* (2013.01); *G01N 21/9501* (2013.01); *G01N 21/956* (2013.01); *G02B 6/0056* (2013.01); *G03F 1/84* (2013.01); *G01N 2021/8848* (2013.01); *G01N 2021/95676* (2013.01); *G01N 2201/068* (2013.01)

(58) Field of Classification Search
CPC .............. G02F 7/7065; G01N 21/8806; G01N 21/8851; G01N 21/9501; G01N 21/956
See application file for complete search history.

(56) References Cited

U.S. PATENT DOCUMENTS 6,407,373 B1 * 6/2002 Dotan ................. H01L 29/7834
257/E29.267
6,670,610 B2  12/2003 Shemesh et al.
(Continued)

FOREIGN PATENT DOCUMENTS

EP  2652776 B1 * 8/2019 ............. G01N 21/21

OTHER PUBLICATIONS

U.S. Appl. No. 17/243,548, "Non-Final Office Action", dated Aug. 22, 2022, 7 pages.

*Primary Examiner* — Rebecca C Bryant
(74) *Attorney, Agent, or Firm* — Kilpatrick Townsend & Stockton LLP

(57) ABSTRACT

Disclosed herein is a method for increasing signal-to-noise (SNR) in optical imaging of defects on unpatterned wafers. The method includes: (i) irradiating a region of an unpatterned wafer with a substantially polarized, incident light beam, and (ii) employing relay optics to collect and guide, radiation scattered off the region, onto a segmented polarizer comprising at least four polarizer segments characterized by respective dimensions and polarization directions. The respective dimensions and polarization direction of each of the at least four polarizer segments are such that an overall power of background noise radiation, generated in the scattering of the incident light beam from the region and passed through all of the at least four polarizer segments, is decreased as compared to utilizing a linear polarizer.

18 Claims, 14 Drawing Sheets

(56) References Cited

U.S. PATENT DOCUMENTS

| | | | |
|---|---|---|---|
| 8,169,613 B1* | 5/2012 | Biellak | G01N 21/8806 |
| | | | 356/369 |
| 8,709,269 B2 | 4/2014 | Shemesh | |
| 9,046,475 B2 | 6/2015 | Langer et al. | |
| 10,948,423 B2 | 3/2021 | Liu et al. | |
| 2017/0276613 A1* | 9/2017 | Liu | G01N 21/21 |
| 2020/0150054 A1 | 5/2020 | Leong et al. | |
| 2021/0333719 A1* | 10/2021 | Kapoano | G03F 7/7065 |
| 2021/0349019 A1* | 11/2021 | Kapoano | G03F 7/7065 |

* cited by examiner

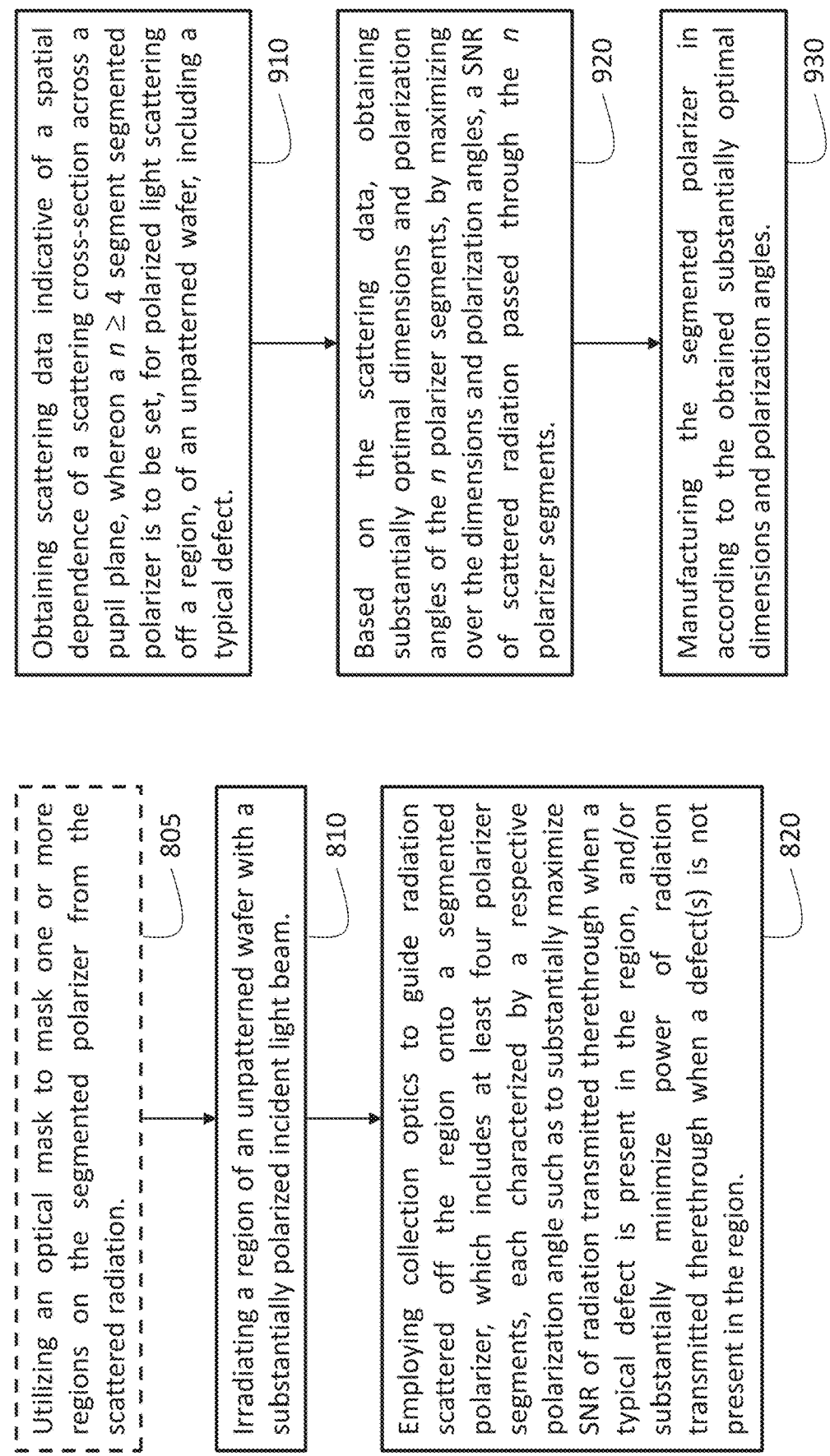

```
┌─────────────────────────────────────────────────────────┐
│ Obtaining scattering data indicative of a spatial        │
│ dependence of a scattering cross-section across a pupil  │
│ plane, whereon a n ≥ 4 segment segmented polarizer is    │
│ to be set, for polarized light scattering off a          │
│ defect-free region of an unpatterned wafer.              │
└─────────────────────────────────────────────────────────┘
                            │
                            ▼               ─ 1010
┌─────────────────────────────────────────────────────────┐
│ Based on the scattering data, obtaining substantially    │
│ optimal dimensions and polarization angles of the n      │
│ polarizer segments, by minimizing, over the dimensions   │
│ and polarization angles, a power of the scattered        │
│ radiation which may be passed through the n polarizer    │
│ segments.                                                │
└─────────────────────────────────────────────────────────┘
                            │
                            ▼               ─ 1020
┌─────────────────────────────────────────────────────────┐
│ Manufacturing the segmented polarizer according to the   │
│ obtained substantially optimal dimensions and            │
│ polarization angles.                                     │
└─────────────────────────────────────────────────────────┘
                                            ─ 1030
```

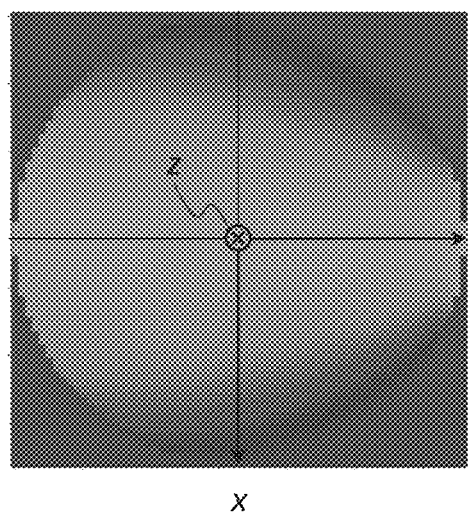
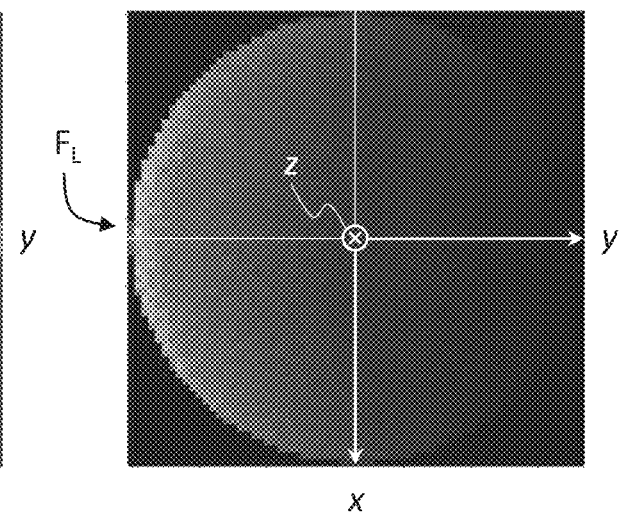
Fig. 11A          Fig. 11B
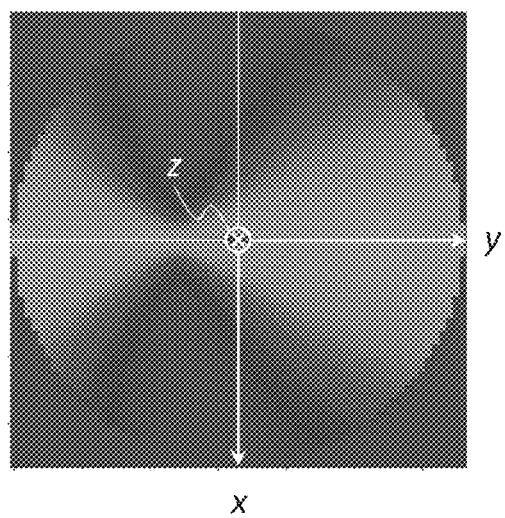
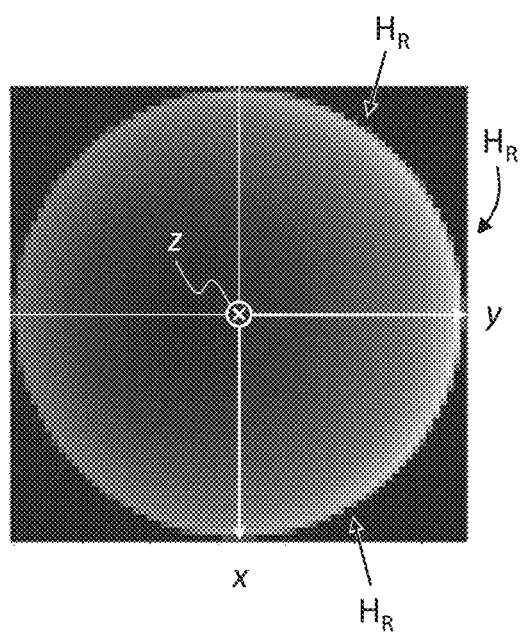
Fig. 11C          Fig. 11D

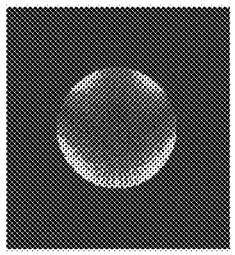 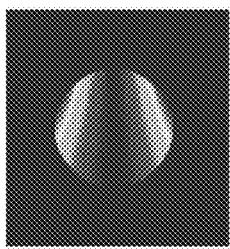 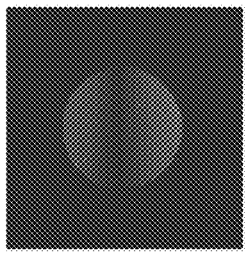
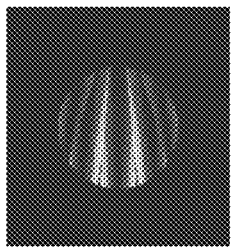 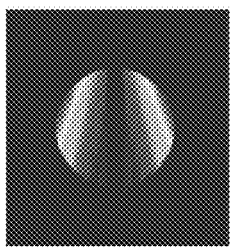 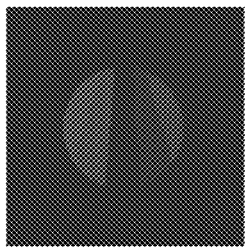
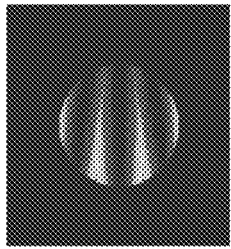 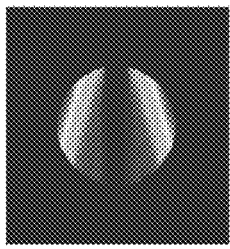 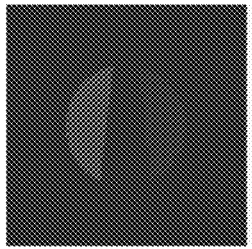
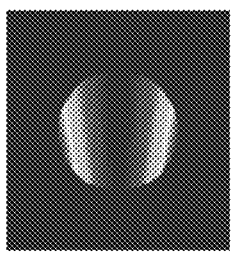 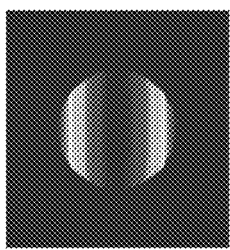 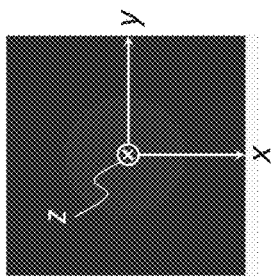
Fig. 12A  Fig. 12B  Fig. 12C  Fig. 12D  Fig. 12E  Fig. 12F

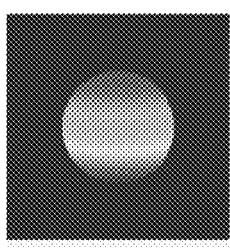
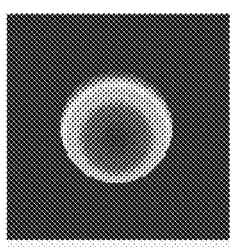
Fig. 13A
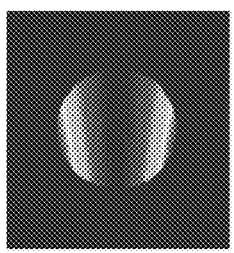
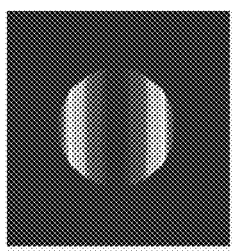
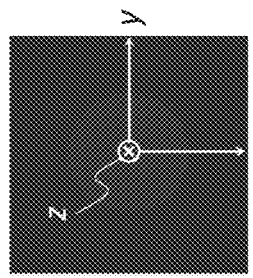
Fig. 13B
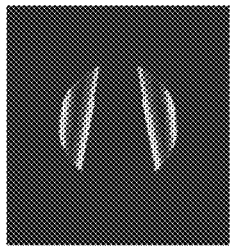
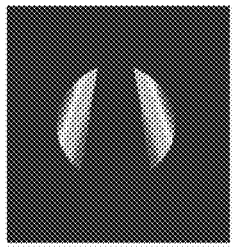
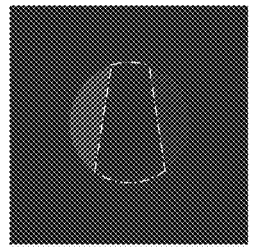
Fig. 13C
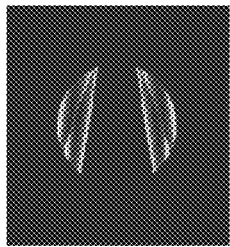
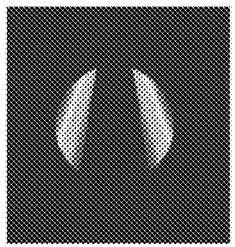
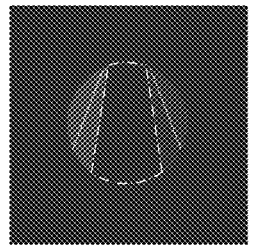
Fig. 13D
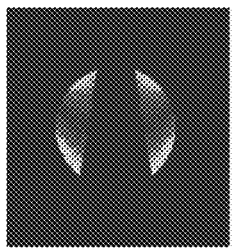
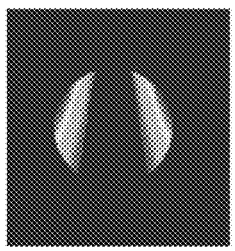
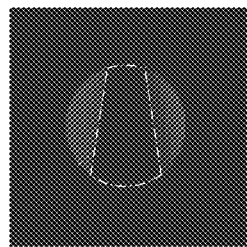
Fig. 13E
Fig. 13F

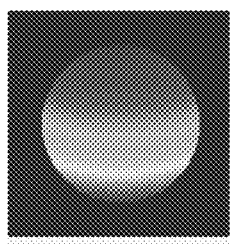
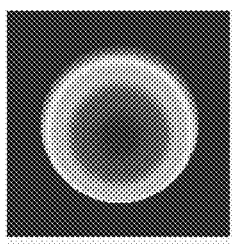
Fig. 14A
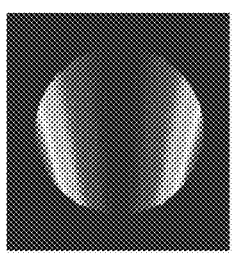
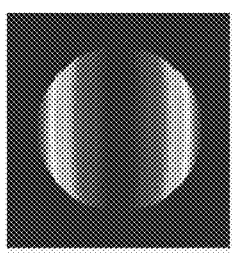
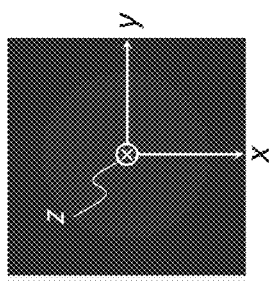
Fig. 14B
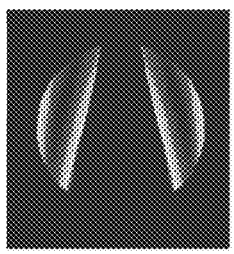
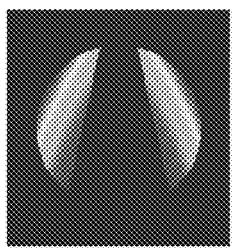
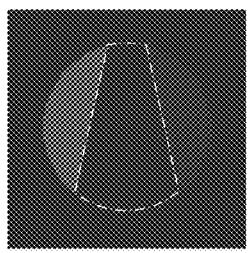
Fig. 14C
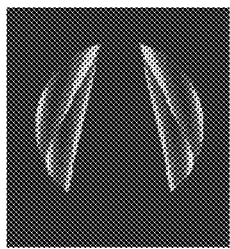
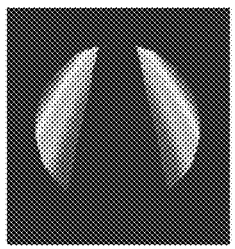
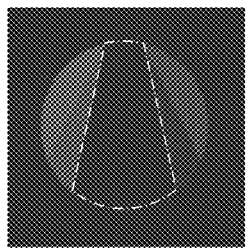
Fig. 14D
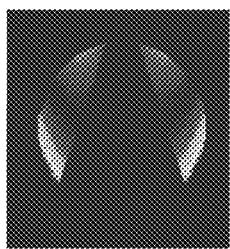
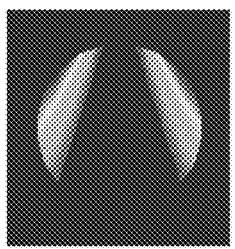
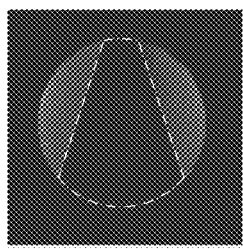
Fig. 14E
Fig. 14F

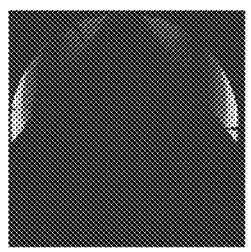 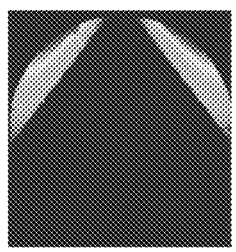 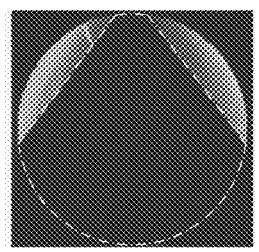
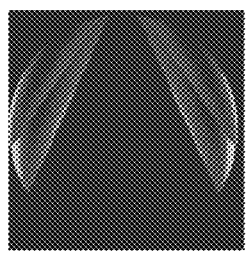 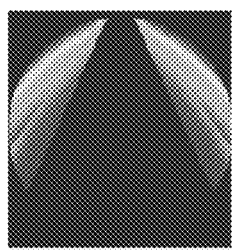 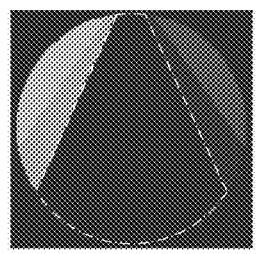
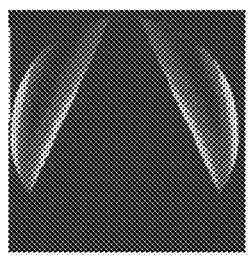 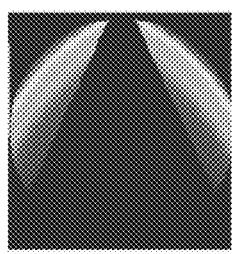 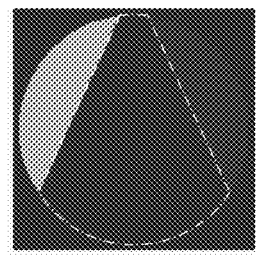
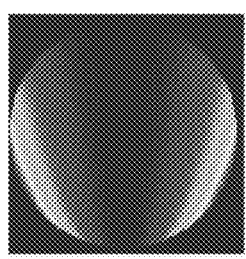 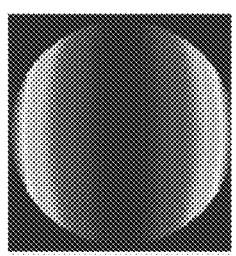 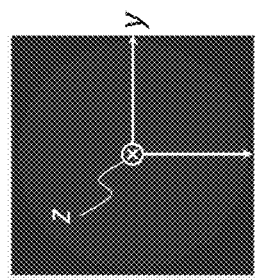
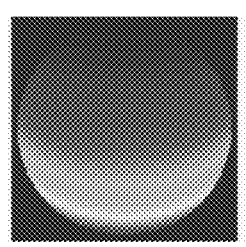 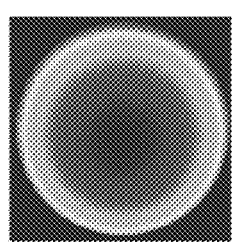 
Fig. 15A  Fig. 15B  Fig. 15C  Fig. 15D  Fig. 15E  Fig. 15F

INCREASING SIGNAL-TO-NOISE RATIO IN OPTICAL IMAGING OF DEFECTS ON UNPATTERNED WAFERS

TECHNICAL FIELD

The present disclosure relates generally to background noise suppression in optical imaging of defects on unpatterned wafers.

BACKGROUND OF THE INVENTION

One of the main challenges in optical imaging of defects on unpatterned (blanket) wafers is the discrimination of a defect signal from background noise due to light scattered off a wafer. This challenge exists both in optical inspection of unpatterned wafers and in unpatterned wafer defect review, wherein, in order to achieve high-throughput, up-to-date (e.g. corrected) defect maps must be obtained before imaging the defects with a scanning-electron microscope (SEM). For this reason, e-beam based (i.e. SEM-based) unpatterned wafer defect review systems typically include an optical imaging subsystem. The optical imaging subsystem is employed to update a defect map (obtained from the optical inspection system, which was employed to inspect the wafer for defects) prior to employing the SEM to obtain high-resolution images of the defects.

BRIEF SUMMARY OF THE INVENTION

Aspects of the disclosure, according to some embodiments thereof, relate to systems and methods for increasing signal-to-noise ratio (SNR) in optical imaging of defects on unpatterned (blanket) wafers, whether as part of unpatterned wafer inspection or unpatterned wafer defect review. More specifically, but not exclusively, aspects of the disclosure, according to some embodiments thereof, relate to SNR improvement in optical-based correction of defect maps in e-beam based protocols for unpatterned wafer defect review.

Thus, according to an aspect of some embodiments, there is provided a system for optical imaging of defects on unpatterned wafers. The system includes an illumination module, relay optics, a segmented polarizer, a stage, and a detector. The illumination module is configured to produce a substantially polarized light beam incident on a selectable region of an unpatterned wafer placed on the stage. The relay optics is configured to collect and guide, radiation scattered off the unpatterned wafer, onto the segmented polarizer. The detector is configured to sense scattered radiation passed through the segmented polarizer. The segmented polarizer includes at least four polarizer segments characterized by respective dimensions and polarization directions. The respective dimensions and polarization direction of each of the at least four polarizer segments are such that an overall power of background noise radiation, generated in the scattering of the incident light beam from the region and passed through all of the at least four polarizer segments, is decreased as compared to utilizing a linear polarizer.

According to some embodiments, the respective dimensions and polarization direction of each of the at least four polarizer segments are such that, when the region includes a defect, an overall SNR of scattered radiation, passed through all of the at least four polarizer segments, is substantially maximized.

According to some embodiments, the respective dimensions and polarization direction of each of the at least four polarizer segments are such that the overall power of the background noise radiation, passed through all of the at least four polarizer segments, is substantially minimized.

According to some embodiments, the at least four polarizer segments are substantially complementary and substantially fully encompass the segmented polarizer (i.e. the at least four polarizer make-up substantially all of the segmented polarizer).

According to some embodiments, the at least four polarizer segments are arranged in as one or more groups in the form of adjacently disposed strips.

According to some embodiments, the at least four polarizer segments are non-complementary.

According to some embodiments, the segmented polarizer includes one or more opaque sections.

According to some embodiments, the system further includes an optical mask configured to prevent one or more regions on the segmented polarizer from being exposed to radiation scattered off an unpatterned wafer placed on the stage and irradiated by the illumination module, and thereby increase a total SNR of scattered radiation passed through the segmented polarizer. Each of at least four, of the at least four polarizer segments, is configured to have at least a part thereof exposed to the scattered radiation.

According to some embodiments, the one or more regions on the segmented polarizer include one or more additional polarizer segments which are distinct from the at least four polarizer segments.

According to some embodiments, the substantially polarized light beam, produced by the illumination module, is substantially linearly polarized.

According to some embodiments, the respective polarization direction of each of the polarizer segments is substantially perpendicular to a mean polarization direction of respective background noise radiation, generated in the scattering of the incident light beam from the region and arriving at the respective polarizer segment (i.e. produced by the scattering of the incident light beam from the region, and collected and guided onto the polarizer segment by the relay optics).

According to some embodiments, the segmented polarizer is substantially set on a pupil of the relay optics.

According to some embodiments, an optical axis defined by the relay optics lies substantially on an incidence plane of the polarized light beam, produced by the illumination module. According to some such embodiments, the optical axis is substantially normal to the wafer.

According to some embodiments, the illumination module is configured to produce the polarized light beam such as to be substantially p-polarized or s-polarized. The at least four polarizer segments substantially jointly exhibit mirror symmetry about an incidence plane of the polarized light beam.

According to some embodiments, the dimensions of the at least four polarizer segments are defined by chords of a circle defined by the pupil.

According to some embodiments, the system further includes a waveplate, positioned between the segmented polarizer and the relay optics. The waveplate is configured to modify the polarization properties of scattered radiation arriving at the segmented polarizer.

According to some embodiments, the waveplate includes a plurality of waveplate segments. Each waveplate segment is configured to modify to a different extent, respectively, a phase between a vertical polarization component and a horizontal polarization component of scattered radiation arriving at the waveplate segment.

According to some embodiments, the illumination module is configured to produce the substantially polarized light beam at a non-zero angle with respect to an optical axis, defined by the relay optics.

According to some embodiments, the substantially polarized light beam is obliquely directed onto the wafer.

According to some embodiments, the substantially polarized light beam, produced by the illumination module, is a laser beam.

According to some embodiments, each of the at least four polarizer segments is a wire-grid polarizer.

According to some embodiments, for each two adjacent segments, from the at least four polarizer segments, an absolute difference between polarization angles (defined by the respective polarization directions) of the two adjacent segments is smaller than (i) an absolute deviation of a polarization angle of the background noise radiation arriving at a first segment from the two adjacent segments, and (ii) an absolute deviation of a polarization angle of the background noise radiation arriving at a second segment from the two adjacent segments.

According to some embodiments, the polarization angles of adjacent segments, from the least four polarizer segments, differ by about 15°, about 10°, about 8°, about 6°, about 5°, about 4°, about 3°, about 2°, about 1°, or even less. Each possibility corresponds to separate embodiments. The polarization angle of a polarized segment is defined by the polarization direction of the polarized segment.

According to an aspect of some embodiments, there is provided a method for optical imaging of defects on unpatterned wafers. The method includes:

Irradiating a region of an unpatterned wafer with a substantially polarized, incident light beam.

Employing relay optics to collect and guide, radiation scattered off the region, onto a segmented polarizer including at least four polarizer segments characterized by respective dimensions and polarization directions.

The respective dimensions and polarization direction of each (polarizer segment) of the at least four polarizer segments are such that an overall power of background noise radiation, generated in the scattering of the incident light beam from the region and passed through all of the at least four polarizer segments, is decreased as compared to utilizing a linear polarizer.

According to some embodiments, the respective dimensions and polarization direction of each of the at least four polarizer segments are such that, when the region includes a defect, an overall SNR of scattered radiation, passed through all of the at least four polarizer segments, is substantially maximized.

According to some embodiments, the respective dimensions and polarization direction of each of the at least four polarizer segments are such that the overall power of the background noise radiation, passed through all of the at least four polarizer segments, is substantially minimized.

According to some embodiments, the at least four polarizer segments are substantially complementary and substantially fully encompass the segmented polarizer.

According to some embodiments, the at least four polarizer segments are arranged in as one or more groups in the form of adjacently disposed strips.

According to some embodiments, the at least four polarizer segments are non-complementary.

According to some embodiments, the segmented polarizer includes one or more opaque sections.

According to some embodiments, the method further includes utilizing an optical mask to prevent one or more regions on the segmented polarizer from being irradiated by the scattered radiation, such as to increase a total SNR of scattered radiation passed through the segmented polarizer.

According to some embodiments, the one or more regions on the segmented polarizer include one or more additional polarizer segments which are distinct from the at least four polarizer segments.

According to some embodiments, the incident light beam is substantially linearly polarized.

According to some embodiments, the respective polarization direction of each of the polarizer segments is substantially perpendicular to a mean polarization direction of respective background noise radiation, generated in the scattering of the incident light beam and arriving at the respective polarizer segment.

According to some embodiments, the segmented polarizer is substantially set on a pupil of (i.e. defined by) the relay optics.

According to some embodiments, an optical axis, defined by the relay optics, lies substantially on an incidence plane of the incident light beam. According to some such embodiments, the optical axis is substantially normal to the wafer.

According to some embodiments, the incident light beam is substantially p-polarized or s-polarized. The at least four polarizer segments substantially jointly exhibit mirror symmetry about an incidence plane of the incident light beam.

According to some embodiments, the dimensions of the at least four polarizer segments are defined (in the sense of delimited) by chords of a circle defined by the pupil.

According to some embodiments, the method further includes utilizing a waveplate, positioned between the segmented polarizer and the relay optics, to modify the polarization properties of scattered radiation arriving at the segmented polarizer.

According to some embodiments, the waveplate includes a plurality of waveplate segments. Each waveplate segment is configured to modify to a different extent (i.e. by a different amount), respectively, a phase between a vertical polarization component and a horizontal polarization component of scattered radiation arriving at the waveplate segment.

According to some embodiments, wherein the incident light beam defines a non-zero angle with respect to an optical axis, defined by the relay optics.

According to some embodiments, the incident light beam is obliquely directed onto the wafer.

According to some embodiments, the incident light beam is an ultraviolet (UV) laser beam.

According to some embodiments, each of the at least four polarizer segments is a wire-grid polarizer.

According to some embodiments, for each two adjacent segments, from the at least four polarizer segments, an absolute difference between polarization angles (defined by the respective polarization directions) of the two adjacent segments is smaller than (i) an absolute deviation of a polarization angle of the scattered radiation through a first segment from the two adjacent segments, in the absence of a defect in the region, and (ii) an absolute deviation of a polarization angle of the scattered radiation through a second segment from the two adjacent segments, in the absence of a defect in the region.

According to some embodiments, the polarization angles of adjacent segments, from the least four polarizer segments, differ by no more than about 15°, about 10°, about 8°, about 6°, about 5°, about 4°, about 3°, about 2°, about 1°, or even less. Each possibility corresponds to separate embodiments.

The polarization angle of a polarized segment is defined by the polarization direction of the polarized segment.

According to an aspect of some embodiments, there is provided a computerized method for unpatterned wafer defect review. The method includes an optical-based stage and a scanning-electron microscope (SEM) based stage. The optical-based stage includes:
- Receiving an unpatterned wafer including one or more detected defects and a defect map specifying coordinates of the one or more detected defects.
- Generating a corrected defect map by, for each of the one or more detected defects:
  - Implementing, with respect to a region of the unpatterned wafer—the region including the detected defect—the above-described method for increasing signal-to-noise ratio in optical imaging of defects on unpatterned wafers.
  - Forming an image of the detected defect from scattered radiation passed through the segmented polarizer.
  - Analyzing the formed image to correct, if necessary, the coordinates of the detected defect.

The SEM-based stage includes:
- Employing a SEM to review the one or more defects, based on the corrected defect map.
- Reviewing SEM-obtained images of the one or more defects.

According to an aspect of some embodiments, there is provided a computerized method for unpatterned wafer defect review. The method includes an optical-based stage and a SEM-based stage. The optical-based stage includes:
- Receiving an unpatterned wafer including one or more detected defects and a defect map specifying coordinates of the one or more detected defects.
- Generating a corrected defect map by, for each of the one or more detected defects:
  - Optically reviewing the defect by:
    - Irradiating a region including the defect with a substantially polarized, incident light beam.
    - Employing relay optics to collect and guide, radiation scattered off the region, onto a segmented polarizer including at least four polarizer segments characterized by respective dimensions and polarization directions.
    - The respective dimensions and polarization direction of each (polarizer segment) of the at least four polarizer segments are such that an overall power of background noise radiation, generated in the scattering of the incident light beam from the region and passed through all of the at least four polarizer segments, is decreased as compared to utilizing a linear polarizer.
    - Forming an image of the detected defect from scattered radiation passed through the segmented polarizer.
    - Analyzing the formed image to correct, if necessary, the coordinates of the detected defect.

The SEM-based stage includes:
- Employing a SEM to review the one or more defects, based on the corrected defect map.
- Reviewing SEM-obtained images of the one or more defects.

According to an aspect of some embodiments, there is provided a computerized method for optical inspection of unpatterned wafers. The method includes:
- Implementing with respect to an unpatterned wafer the above-described method for increasing signal-to-noise ratio in optical imaging of defects on unpatterned wafers.
- Employing a detector to sense scattered radiation passed through the segmented polarizer, thereby obtaining image data of the unpatterned wafer.
- Analyzing the obtained image data to detect defects on the unpatterned wafer.

According to some embodiments, the respective dimensions and polarization direction of each of the at least four polarizer segments are such that, when the region includes a defect, an overall SNR of scattered radiation, passed through all of the at least four polarizer segments, is substantially maximized.

According to an aspect of some embodiments, there is provided a computerized method for optical inspection of unpatterned wafers. The method includes:
- An optical irradiation stage including:
  - Successively irradiating regions of an unpatterned wafer with a substantially polarized, incident light beam.
  - Employing relay optics to collect and guide, radiation scattered off each region, onto a segmented polarizer including at least four polarizer segments characterized by respective dimensions and polarization directions.
  - The respective dimensions and polarization direction of each (polarizer segment) of the at least four polarizer segments are such that an overall power of background noise radiation, generated in the scattering of the incident light beam from the region and passed through all of the at least four polarizer segments, is decreased as compared to utilizing a linear polarizer.
- Employing a detector to sense scattered radiation passed through the segmented polarizer, thereby obtaining image data of the unpatterned wafer.
- Analyzing the obtained image data to detect defects on the unpatterned wafer.

According to some embodiments, the respective dimensions and polarization direction of each of the at least four polarizer segments are such that, when the region includes a defect, an overall SNR of scattered radiation, passed through all of the at least four polarizer segments, is substantially maximized.

According to an aspect of some embodiments, there is provided a method for manufacturing a n≥4 segmented polarizer configured for increasing SNR in optical imaging of defects on unpatterned wafers. The method includes:
- Obtaining scattering data indicative of a spatial dependence of a scattering cross-section on a pupil plane, whereon the segmented polarizer is to be set, under conditions of polarized light scattering off an unpatterned wafer region including a typical defect.
- Based on the scattering data, obtaining substantially optimal dimensions and polarization angles of the n polarizer segments, by substantially maximizing, over the dimensions and polarization angles, a SNR of the scattered radiation which would be passed through the n polarizer segments under the above-specified conditions.
- Manufacturing the segmented polarizer in accordance with the obtained substantially optimal dimensions and polarization angles.

According to an aspect of some embodiments, there is provided a method for manufacturing a n≥4 segmented polarizer configured for suppressing background noise in optical imaging of defects on unpatterned wafers. The method includes:
- Obtaining scattering data indicative of a spatial dependence of a scattering cross-section on a pupil plane, whereon the segmented polarizer is to be set, under conditions of polarized light scattering off a defect-free region of an unpatterned wafer.

Based on the scattering data, obtaining substantially optimal dimensions and polarization angles of the n polarizer segments, by substantially minimizing, over the dimensions and polarization angles, a power of the scattered radiation which would be passed through the n polarizer segments under the above-specified conditions.

Manufacturing the segmented polarizer in accordance with the obtained substantially optimal dimensions and polarization angles.

Certain embodiments of the present disclosure may include some, all, or none of the above advantages. One or more other technical advantages may be readily apparent to those skilled in the art from the figures, descriptions, and claims included herein. Moreover, while specific advantages have been enumerated above, various embodiments may include all, some, or none of the enumerated advantages.

Unless otherwise defined, all technical and scientific terms used herein have the same meaning as commonly understood by one of ordinary skill in the art to which this disclosure pertains. In case of conflict, the patent specification, including definitions, governs. As used herein, the indefinite articles "a" and "an" mean "at least one" or "one or more" unless the context clearly dictates otherwise.

Unless specifically stated otherwise, as apparent from the disclosure, it is appreciated that, according to some embodiments, terms such as "processing", "computing", "calculating", "determining", "estimating", "assessing", "gauging" or the like, may refer to the action and/or processes of a computer or computing system, or similar electronic computing device, that manipulate and/or transform data, represented as physical (e.g. electronic) quantities within the computing system's registers and/or memories, into other data similarly represented as physical quantities within the computing system's memories, registers or other such information storage, transmission or display devices.

Embodiments of the present disclosure may include apparatuses for performing the operations herein. The apparatuses may be specially constructed for the desired purposes or may include a general-purpose computer(s) selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method(s). The desired structure(s) for a variety of these systems appear from the description below. In addition, embodiments of the present disclosure are not described with reference to any particular programming language. It will be appreciated that a variety of programming languages may be used to implement the teachings of the present disclosure as described herein.

Aspects of the disclosure may be described in the general context of computer-executable instructions, such as program modules, being executed by a computer. Generally, program modules include routines, programs, objects, components, data structures, and so forth, which perform particular tasks or implement particular abstract data types. Disclosed embodiments may also be practiced in distributed computing environments where tasks are performed by remote processing devices that are linked through a communications network. In a distributed computing environment, program modules may be located in both local and remote computer storage media including memory storage devices.

BRIEF DESCRIPTION OF THE DRAWINGS

Some embodiments of the disclosure are described herein with reference to the accompanying figures. The description, together with the figures, makes apparent to a person having ordinary skill in the art how some embodiments may be practiced. The figures are for the purpose of illustrative description and no attempt is made to show structural details of an embodiment in more detail than is necessary for a fundamental understanding of the disclosure. For the sake of clarity, some objects depicted in the figures are not drawn to scale. Moreover, two different objects in the same figure may be drawn to different scales. In particular, the scale of some objects in a figure may be greatly exaggerated as compared to other objects in the (same) figure.

In the figures:

FIG. 8 presents a flowchart of a method for increasing signal-to-noise ratio in imaging of defects on unpatterned wafers, according to some embodiments;

FIG. 9 presents a flowchart of a method for manufacturing a segmented polarizer configured for increasing signal-to-noise ratio in imaging of defects on unpatterned wafers, according to some embodiments;

FIG. 10 presents a flowchart of a method for manufacturing a segmented polarizer configured for suppressing background noise in imaging of defects on unpatterned wafers, according to some embodiments;

FIG. 11A-11D present results of simulations of the system of FIG. 1A, according to some embodiments thereof; shown are polarization direction and intensity distributions, respectively—across a pupil defined by relay optics of the system—of p-polarized incident radiation scattered off an unpatterned wafer in the defect-free case and in the presence of a typical defect in the illumination area;

FIG. 12A-12F present results of simulations of the system of FIG. 1A, according to some embodiments thereof, which are characterized by a 0.5 numerical aperture; shown are intensity distributions—across the pupil—of p-polarized incident radiation scattered off an unpatterned wafer (i) in the defect-free case, and (ii) when a typical defect is present in the illumination area, wherein the choice of polarizers varies between FIGS. 12B-12E;

FIG. 13A-13F present results of simulations of the system of FIG. 1A, according to some embodiments thereof characterized by a 0.5 numerical aperture; shown are intensity distributions—across the pupil—of p-polarized incident radiation scattered off an unpatterned wafer (i) in the defect-free case, and (ii) when a typical defect is present in the illumination area, wherein the choice of polarizers varies between FIGS. 13B-13E and an optical mask was employed;

FIG. 14A-14F present results of simulations of the system of FIG. 1A, according to some embodiments thereof characterized by a 0.7 numerical aperture; shown are intensity distributions—across the pupil—of p-polarized incident radiation scattered off an unpatterned wafer (i) in the defect-free case, and (ii) when a typical defect is present in the illumination area, wherein the choice of polarizers varies between FIGS. 14B-14E and an optical mask was employed; and FIG. 15A-15F present results of simulations of the system of FIG. 1A, according to some embodiments thereof characterized by a 0.95 numerical aperture; shown are intensity distributions—across the pupil—of p-polarized incident radiation scattered off an unpatterned wafer (i) in the defect-free case, and (ii) when a typical defect is present in the illumination area, wherein the choice of polarizers varies between FIGS. 15B-15E and an optical mask was employed.

DETAILED DESCRIPTION OF THE INVENTION

Figure 1A:
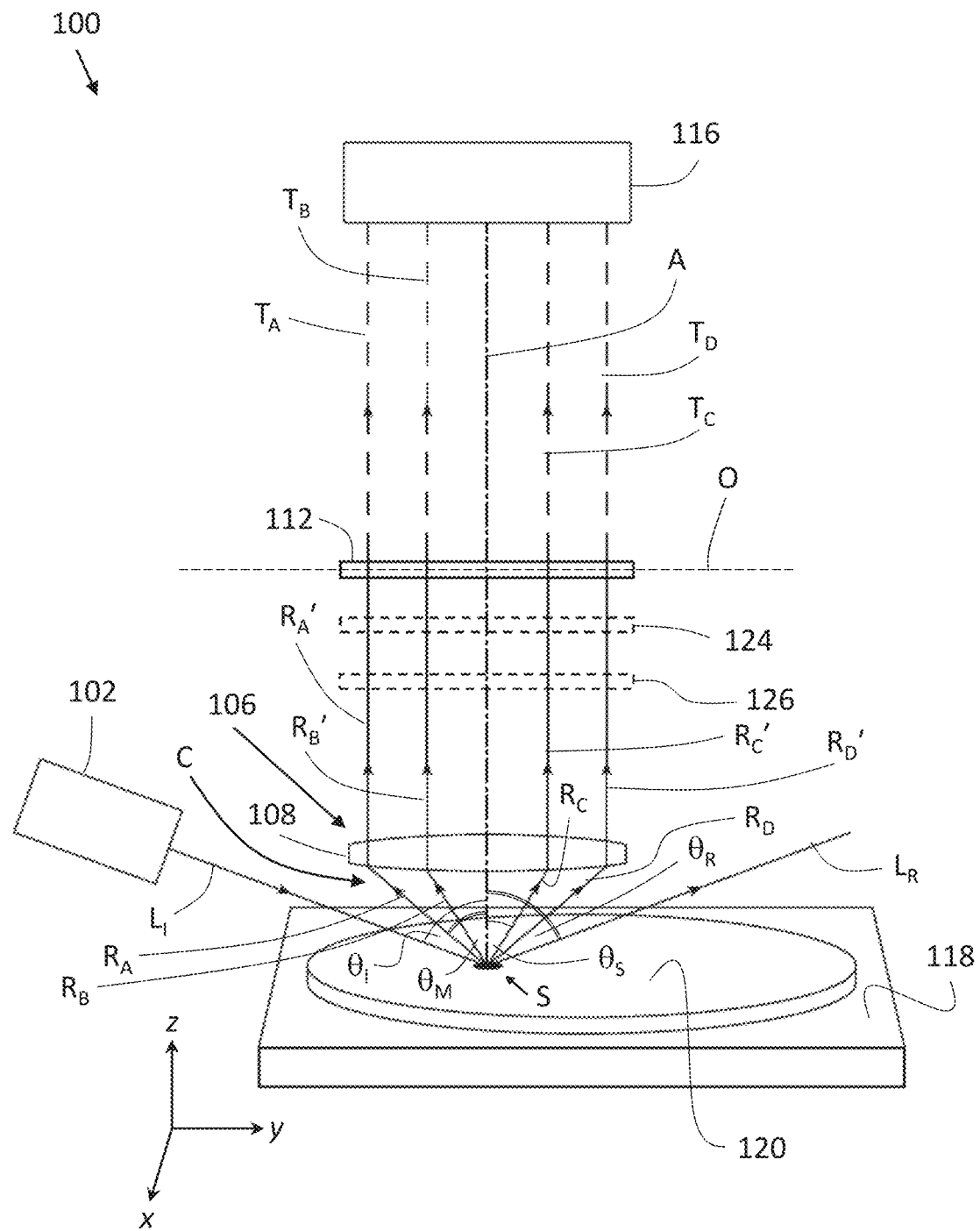
FIG. 1A schematically depicts an optical system for imaging of defects on unpatterned wafers, with an unpatterned wafer placed thereon, the system including a segmented polarizer, according to some embodiments.

The principles, uses, and implementations of the teachings herein may be better understood with reference to the accompanying description and figures. Upon perusal of the description and figures present herein, one skilled in the art will be able to implement the teachings herein without undue effort or experimentation. In the figures, same reference numerals refer to same parts throughout.

In the description and claims of the application, the words "include" and "have", and forms thereof, are not limited to members in a list with which the words may be associated.

As used herein, the term "substantially" may be used to specify that a first property, quantity, or parameter is close or equal to a second or a target property, quantity, or parameter. For example, a first object and a second object may said to be of "substantially the same shape and dimensions", when a maximum overlap between the first object and the second object is such that at least 80% (or some other pre-defined threshold percentage) of the volume of the first object overlaps with the second object, and at least at least 80% (or some other pre-defined threshold percentage) of the volume occupied of the second object overlaps with the first object. In particular, the case wherein the first object of the same shape and dimensions is also encompassed by the statement that the first object and the second object are of "substantially the same shape and dimensions".

According to some embodiments, the target quantity may refer to an optimal parameter, which may in principle be obtainable using mathematical optimization software. Accordingly, for example, a value assumed by a parameter may be said to be "substantially equal" to the maximum possible value assumable by the parameter, when the value of the parameter is equal to at least 80% (or some other pre-defined threshold percentage) of the maximum possible value. In particular, the case wherein the value of the parameter is equal to the maximum possible value is also encompassed by the statement that the value assumed by the parameter is "substantially equal" to the maximum possible value assumable by the parameter.

As used herein, the term "about" may be used to specify a value of a quantity or parameter (e.g. the length of an element) to within a continuous range of values in the neighborhood of (and including) a given (stated) value. According to some embodiments, "about" may specify the value of a parameter to be between 80% and 120% of the given value. For example, the statement "the length of the element is equal to about 1 m" is equivalent to the statement "the length of the element is between 0.8 m and 1.2 m". According to some embodiments, "about" may specify the value of a parameter to be between 90% and 110% of the given value. According to some embodiments, "about" may specify the value of a parameter to be between 95% and 105% of the given value.

As used herein, according to some embodiments, the terms "substantially" and "about" may be interchangeable.

Referring to the figures, in flowcharts and block diagrams, optional operations and elements/components may appear within boxes delineated by a dashed line.

The terms "top" and "bottom", when used to refer to elements in figures, are to be understood relative to the page, as held by a reader perusing the figures.

The relative terms "left" and "right", when used to refer to elements in figures, are to be understood as in everyday usage, wherein, for example, the first letter of a word (in English) will be understood to be located closer to the left edge of a page than the second letter in the word, and so on. Thus, a first element in a figure may be said to be positioned to the "left" of a second element in the figure, when positioned closer to the left edge of the page than the second element.

Similarly, the relative terms "above" and "below", when used to refer to elements in figures—for example, when a first element is said to be positioned "above" a second element—are to be understood as in everyday usage, so that the first element will be located closer to the top of the page than the second element.

For ease of description, in some of the figures a three-dimensional cartesian coordinate system (with orthogonal axes x, y, and z) is introduced. It is noted that the orientation of the coordinate system relative to a depicted object may vary from one figure to another. Further, the symbol ⊙ may be used to represent an axis pointing "out of the page", while the symbol ⊗ may be used to represent an axis pointing "into the page".

INTRODUCTION

Aspects of the disclosure, according to some embodiments, are directed at background noise suppression in optical imaging of defects on unpatterned (blanket) wafers, both in the context of (optical) inspection of unpatterned wafers and in the context of defect map correction in electron-beam (e-beam) based (unpatterned wafer) defect review. To this end, the disclosed systems and methods exploit the change brought about to the scattering cross-section of polarized light as a result of a typical (three-dimensional) defect being present in an illuminated region on an unpatterned wafer.

More specifically, when a linearly polarized light beam is incident on a nanorough surface (such as the surface of an unpatterned wafer), the (collected) polarization cross-section exhibits substantially uniform linear polarization over sizeable solid angles. The present application, according to some embodiments, discloses a segmented polarizer, wherein different polarizer segments are characterized by different polarization angles. The polarization angle of the transmission axis of each polarizer segment may be selected to be orthogonal to the predominant polarization component of a respective background noise radiation arriving at the polarizer segment (and generated in the scattering of linearly polarized light off an unpatterned wafer). The spatial dependence of the polarization cross-section (across the pupil plane) may thus be addressed on a segment-by-segment basis. This leads to a significant increase in the signal-to-noise ratio (SNR) when a defect is present, and allows for considerably improved discrimination of defect signatures (radiation signals) from pure background noise.

Advantageously, according to some embodiments, the segmented polarizer may include dozens (e.g. fifty, a hundred, or even more) polarizer segments (e.g. in the form of strips), wherein polarization angles of adjacent polarizer segments may vary effectively continuously. That is, in such embodiments, the segmented polarizer effectively functions as a continuous polarizer, with the polarization angle changing effectively continuously as a function of the location on the polarizer.

As used here, the terms "p-polarization" and "transverse magnetic (TM) polarization" are used interchangeably. Similarly, the terms "s-polarization" and "transverse electric (TE) polarization" are used interchangeably.

As used herein, according to some embodiments, the terms "polarization angle" and "polarization direction" may be used interchangeably. In particular, according to some embodiments, terms "polarization angle" and "polarization direction", when used in reference to a polarizer (e.g. polarizing filter), will be understood to refer to the orientation of the transmission axis of the polarizer.

As used herein, according to some embodiments, the term "substantially polarized light" covers both partially polarized light with a degree of polarization $\wp$ greater than (or equal to) 0.8, as well as purely polarized light, i.e. (i.e. $\wp = 1$). $\wp = \sqrt{S_1^2 + S_2^2 + S_3^2}/S_0$, wherein $S_0$, $S_1$, $S_2$, and $S_3$ are the Stokes parameters characterizing the polarization of the light.

As used herein, according to some embodiments, the terms light", "light beam", and "radiation" may be used interchangeably. Similarly, according to some embodiments, the terms "illumination" and "irradiation", and derivatives thereof, may be used interchangeably.

As used herein, the term "scattering" with reference to light returned from a surface illuminated by a light beam, excludes (specular) reflection.

As used herein, the terms "unpatterned wafer" and "blanket wafer" are used interchangeably.

As used herein, according to some embodiments, a segmented polarizer may be said to be "semi-continuous" when including at least twenty segments.

As used herein, the term "polarizer segment" refers to a portion of a segmented polarizer, such that the portion is of itself a polarizer. More specifically, a portion (of a segmented polarizer), whether opaque or transparent, and which, in particular, does not selectively filter light based on polarization, will not be referred to herein as a "polarizer segment".

As used herein, according to some embodiments, the term "typical defect" may refer to a three-dimensional defect that is of an average shape, and optionally size, which are characteristic of defects on unpatterned wafers. The average shape and size may be obtained, for example, by imaging a large number of defects on an unpatterned wafer(s), obtaining parameters mathematically parameterizing the shape, and optionally the size, of each the imaged defects, and averaging over the parameters.

Systems

According to an aspect of some embodiments, there is provided a system for optical imaging of defects on unpatterned wafers. FIG. 1A schematically depicts such a system, a system 100, according to some embodiments. System 100 includes an illumination module 102, relay optics 106 including at least an objective lens 108, a segmented polarizer 112, and a detector 116. Also depicted is a stage 118 for placement thereon of an (unpatterned) wafer, such as an unpatterned wafer 120, which is to be imaged. Optionally, system 100 may further include additional optics (not shown), such as, for example, a tube lens, for focusing light passed through (i.e. transmitted through) segmented polarizer 112 onto detector 116.

Illumination module 102 may be configured to generate an incident light beam LI directed at an (upper surface of) unpatterned wafer 120 at an incidence angle $\theta_I$. The incident light beam may define an illumination area S on unpatterned wafer 120. The incident light beam may be polarized, for example, linearly polarized or elliptically polarized. According to some embodiments, the incident light beam may be a laser beam. According to some embodiments, the polarization of the incident light beam may be controllably selected (e.g. to be p-polarized, s-polarized, circularly polarized, and so on). A reflected light beam $L_R$ represents a part of the returned light, which is specularly reflected, and therefore returned at a reflection $\theta_R = \theta_I$.

According to some embodiments, such as embodiments wherein detector 116 is a camera, the illumination area S may correspond to a region (of unpatterned wafer 120)

which has every sub-region thereof simultaneously irradiated by the incident light beam $L_I$. According to some alternative embodiments, wherein illumination module 102 is configured to generate a "flying spot", the illumination area S may correspond to a region (of unpatterned wafer 120), whose sub-regions are successively irradiated by the incident light beam $L_I$. In such embodiments, light scattered off each sub-region is sensed at different and non-overlapping times by detector 116. In particular, the scope of the disclosure will be understood to cover both of these options.

Objective lens 108 may be positioned such that at least a portion of the scattered radiation (e.g. diffusely scattered light) arrives thereat. Objective lens 108 is configured to focus the scattered radiation arriving thereat, such as to form (optionally, together with additional optical components (not shown), e.g. lenses, which may be included in relay optics 106) a collimated light beam directed onto segmented polarizer 112. Segmented polarizer 112 includes a plurality of polarizer segments. According to some embodiments, segmented polarizer 112 includes at least three polarizer segments, and, preferably, four or more polarizer segments. Each of the polarizer segments may be characterized by a different polarization angle, as elaborated on below. Light filtered through segmented polarizer 112 is directed, optionally utilizing additional optics (not shown), onto detector 116. Detector 116 is configured to sense the light filtered through segmented polarizer 112, thereby allowing to produce an image of the illumination area S.

Also indicated in FIG. 1A is an optical axis A defined by relay optics 106. According to some embodiments, the optical axis A and the incident light beam $L_I$ span a non-zero angle therebetween, such that the returned light beam $L_R$ is not collected by relay optics 106. According to some embodiments, the incident light beam $L_I$ is obliquely directed onto unpatterned wafer 120. According to some such embodiments, and as depicted in FIG. 1A, the optical axis A is perpendicular to unpatterned wafer 120 (and $\theta_I > 0°$). According to some alternative embodiments, not depicted in FIG. 1A, the incident light beam $L_I$ may be perpendicular to unpatterned wafer 120 (i.e. $\theta_I = 0°$) and the optical axis A may define an acute angle (smaller than 90°) with respect to unpatterned wafer 120. According to some embodiments, not depicted in FIG. 1A, each of the incident light beam $L_I$ and the optical axis A defines a respective acute angle with respect to unpatterned wafer 120.

According to some embodiments, and as depicted in FIG. 1A, objective lens 108 is positioned and oriented in such that the scattered radiation arriving thereat forms a cone C of light scattered off unpatterned wafer 120 at a range of (polar) scattering angles between 0° and $\theta_M$. According to some embodiments, the cone C does not include the reflected light beam $L_R$. According to some such embodiments, and as depicted in the figures, $\theta_M < \theta_R$, thereby ensuring that the cone C does not include the reflected light beam $L_R$.

According to some embodiments, system 100 may further include an optical mask 124. Optical mask 124 may be positioned below segmented polarizer 112, i.e. between relay optics 106 and segmented polarizer 112. According to some embodiments, optical mask 124 may be positioned adjacently to segmented polarizer 112. According to some alternative embodiments, optical mask 124 may be positioned above segmented polarizer 112 (e.g. adjacently thereto). Optical mask 124 is configured to block one or more portions of the collimated light beam exiting relay optics 106. Consequently, one or more corresponding regions of segmented polarizer 112 are substantially not illuminated by the collimated light beam.

According to some embodiments, system 100 may further include a waveplate 126 (i.e. a retarder plate). Waveplate 126 may be positioned between relay optics 106 and segmented polarizer 112. According to some embodiments, optical mask 124 may be positioned adjacently to segmented polarizer 112 (between relay optics 106 and segmented polarizer 112). According to some embodiments, wherein system 100 further includes optical mask 124, waveplate 126 may be positioned adjacently to optical mask 124 from above or below (i.e. between relays optics 106 and optical mask 124 or between optical mask 124 and segmented polarizer 112). The function of waveplate 126 is explained below.

According to some embodiments, and as elaborated on below, optical mask 124 may be controllably adjustable, such to as to allow changing a size, shape, position, and/or orientation thereof. This in turn allows to control the size and/or shape of a region(s) of segmented polarizer 112, which is to be "masked" (i.e. blocked) from the collimated light beam.

As used herein, the term "optical mask" may be used in a broad sense to refer to any optical element or means, which when illuminated with a light beam, blocks one or more portions of the light beam. The blocking may be implemented, for example, by one or more corresponding light-reflecting or light-absorbing portions of the optical element.

According to some embodiments, optical mask 124 may be integrated with segmented polarizer 112. For example, optical mask 124 may be adhered onto segmented polarizer 112. According to some embodiments, optical mask 124 may constitute a coating on segmented polarizer 112, such as an opaque layer of reflecting or absorbing material.

According to some embodiments, polarizer segments 132 may be non-complementary in the sense of not fully encompassing of segmented polarizer 112. That is, in such embodiments polarizer segments 132 do not constitute all of segmented polarizer 112. According to some such embodiments, one or more sections of segmented polarizer 112, which are distinct from polarizer segments 132, may be made of an opaque material (in the sense of not passing any light therethrough irrespective of the polarization of the light).

Segmented polarizer 112 may be substantially set on a pupil plane O defined by relay optics 106. According to some embodiments, objective lens 108 may be oriented in parallel to unpatterned wafer 120. More generally, relay optics 106 may be configured such that the optical axis A defined thereby (and, in particular, an optical axis of objective lens 108) is perpendicular to unpatterned wafer 120. According to some embodiments, segmented polarizer 112, and, optionally, optical mask 124, may be oriented in parallel to unpatterned wafer 120 (with segmented polarizer 112 being substantially set on the pupil plane O).

According to some embodiments, system 100 may be configured such that an incidence plane M (indicated in FIG. 1B), defined by the incident light beam LI, bisects (i.e. cuts into two equals halves) objective lens 108. According to some embodiments, system 100 may be configured such that the incidence plane bisects segmented polarizer 112, and, optionally, optical mask 124. More specifically, according to some embodiments, wherein illumination module 102 is configured to produce p-polarized or s-polarized light, segmented polarizer 112 may be configured accordingly by exhibiting mirror symmetry about the incidence plane. That is, the spatial distribution of polarization angles, characterizing the polarizer segments, may exhibit mirror symmetry about the incidence plane. According to some embodiments, optical mask 124 may also exhibit mirror symmetry about the incidence plane. According to some embodiments, waveplate mask 126 may also exhibit mirror symmetry about the incidence plane. According to some embodiments, system 100 may be configured such that the illumination area S (defined by the incident light beam $L_I$) is centered about the optical axis A. It is noted that in such embodiments, and as depicted in FIG. 1A, the cone C (whose base is defined by the illumination area S) is also centered about the optical axis A.

Four scattered light rays, $R_A$, $R_B$, $R_C$, and $R_D$, which are scattered along the incidence plane M, are depicted in FIG. 1A. The light rays $R_A$ and $R_D$ are each scattered at the polar angle $\theta_M$, but at azimuth angles of 270° (in other words, −90°) and 90°, respectively. (The azimuth angle being defined in FIG. 1A as ranging counterclockwise, from the positive x-axis.) The light rays $R_A$ and $R_D$ thus each lie on the surface of the cone C. The light rays $R_B$ and $R_C$ are each scattered at a polar angle $\theta_S < \theta_M$, but at azimuth angles of 270° and 90°, respectively. Light rays $R_B$ and $R_C$ thus each lie within the cone C.

The light rays $R_A'$, $R_B'$, $R_C'$, and $R_D'$ correspond to the light rays $R_A$, $R_B$, $R_C$, and $R_D$, respectively, after being refracted by objective lens 108. The light rays $T_A$, $T_B$, $T_C$, and $T_D$ correspond to the light rays $R_A'$, $R_B'$, $R_C'$, and $R_D'$, respectively, after being filtered through segmented polarizer 112 (and, optical mask 124, when present). According to some embodiments, the intensity of the light rays $T_A$, $T_B$, $T_C$, and $T_D$—in particular since each of the depicted light rays scatters along the incidence plane—substantially vanishes. In FIG. 1A, each of the light rays $T_A$, $T_B$, $T_C$, and $T_D$ is indicated by a dashed line to indicate that in some embodiments the light ray may not be present, i.e. when the corresponding light ray exiting objective lens 108 is fully filtered out by segmented polarizer 112, and/or fully blocked optical mask 124, when present.

According to some embodiments, stage 118 may be moveable and/or rotatable, such as to allow moving and/or rotating unpatterned wafer 120 and scanning or reviewing different regions thereof, as known in the art of wafer analysis. In particular, this allows for maintaining the configurations described above (i.e. the mirror symmetry of segmented polarizer 112 with respect to the incidence plane, the centering of objective lens 108 with respect to the illumination area S) when scanning or reviewing different regions of unpatterned wafer 120.

Figure 1C:
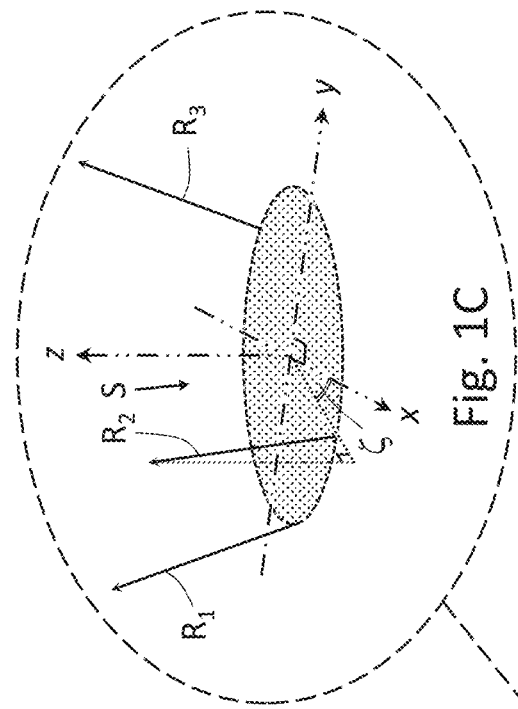
FIG. 1C schematically depicts a region on the unpatterned wafer of FIG. 1A, which is centered about an illumination area, according to some embodiments.
Figure 1B:
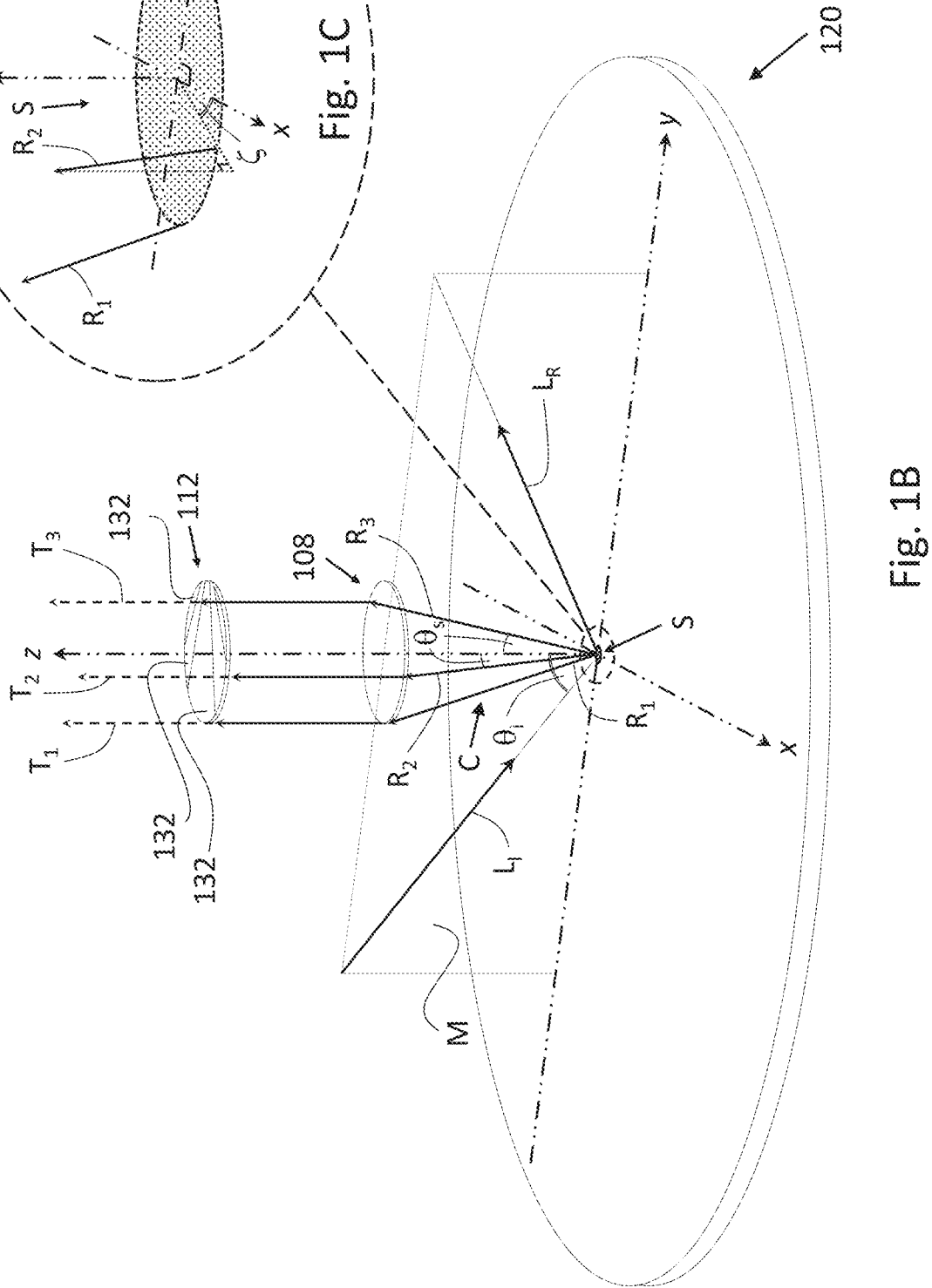
FIG. 1B presents a schematic, perspective, part view (in the sense that not all components are shown) of the system and the unpatterned wafer of FIG. 1A, according to some embodiments.

Referring also to FIG. 1B, FIG. 1B is a schematic, perspective view depicting some of the components of system 100, according to some embodiments. Shown are objective lens 108 and segmented polarizer 112. Also shown is unpatterned wafer 120. Three light rays, each returned at the (polar) scattering angle $\theta_M$ are indicated: a first scattered light ray $R_1$, a second scattered light ray $R_2$, and a third scattered light ray $R_3$. It is noted that all of the light rays returned at the scattering angle $\theta_M$ form the surface of the cone C, which is scattered onto objective lens 108. The light rays $R_1$, $R_2$, and $R_3$ are also indicated in FIG. 1C, which provides an enlarged view of the illumination area S. Further indicated is an angle $\zeta$ on the xy-plane. $\zeta = 360° - \varphi_2$, wherein $\varphi_2$ is the azimuth angle at which the second light ray $R_2$ is scattered.

It is noted that in FIG. 1B, the choice of coordinate system is such that the yz-plane coincides with the incidence plane M and the z-axis coincides with the optical axis A.

According to some embodiments, segmented polarizer 112 may be configured to be utilized in conjunction with a particular preparation polarization (i.e. the polarization of the incident light beam $L_I$), such as, for example, p-polarization, s-polarization, or even an intermediate linear polarization between p and s. The choice of incident polarization is dependent on the context. Incident p-polarization may be more useful for detecting small defects, as typically the defect will scatter more (and accordingly reflect less) of incident p-polarization as compared to incident s-polarization. Incident s-polarization may be more useful for comparatively high-roughness surfaces (and, consequently, larger defects).

By stating that segmented polarizer 112 is configured to be utilized in conjunction with a particular preparation polarization, what is meant is that for the particular preparation polarization, performance of system 100, according to some target measure (e.g. maximum suppression of background noise), is substantially optimized. A particular preparation polarization, to which segmented polarizer 112 is suited (in the sense of being configured to be utilized therewith), will be referred to as a "suitable preparation polarization".

According to some embodiments, for the suitable preparation polarization, a respective polarization angle of each of the polarizer segments is such as to substantially minimize the power of scattered radiation passed therethrough in the defect-free case (i.e. when no defect is present in the illumination area S), That is, the polarization angle is such as to substantially minimize the background noise filtered through the respective polarizer segment.

More generally, according to some embodiments, the dimensions (sizes and shapes) and polarization angles of each of the polarizer segments are such that for the suitable preparation polarization, the (overall) power of radiation passed through segmented polarizer 112 is substantially minimized in the defect-free case. In particular, according to such some embodiments, for each polarizer segment, the power of radiation passed therethrough may be substantially minimized, so that, in consequence, the (overall) power of the radiation passed through segmented polarizer 112 is substantially minimized. The (overall) power of the radiation passed through segmented polarizer 112 is equal to the sum of the powers of the radiations passed through each of polarizer segments 132, respectively.

According to some embodiments, for the suitable polarization preparation, the polarization angles of the polarizer segments are such that respective SNRs of scattered light, passed through each of the polarizer segments, respectively, are substantially maximized for a typical-defect radiation signal (i.e. when the illumination area S includes a typical defect).

More generally, according to some embodiments, the polarization angles and dimensions of each of the polarizer segments are such that for the suitable polarization preparation, the SNR of scattered light, passed through segmented polarizer 112, is substantially maximized, when the illumination area includes a typical (three-dimensional) defect. In particular, according to such some embodiments, for each of the polarizer segments, the SNR of scattered light, passed therethrough, may be substantially maximized, so that, in consequence, the SNR of the light passed through segmented polarizer 112 is substantially maximized.

According to some embodiments, wherein polarizer segments 132 include adjacent segments, the polarization angles of adjacent segments differ by no more than about 15°, about 10°, about 8°, about 6°, about 5°, about 4°, about 3°, about 2°, about 1°, or even less. Each possibility corresponds to separate embodiments. Generally, the greater the number of polarizer segments, the smaller the difference between polarization angles of adjacent segments.

According to some embodiments, segmented polarizer 112 is a wire-grid polarizer (WGP). More specifically, according to some embodiments, each of polarizer segments 132 is a WGP configured to pass through the polarizer segment light at a respective polarization direction.

According to some embodiments, the dimensions and polarization angles of each of polarizer segments 132, and the dimensions of optical mask 124 (and/or any opaque sections of segmented polarizer 112, if present) and the positioning thereof relative to segmented polarizer 112 (and/or the positioning of the opaque sections, if present), are such that for the suitable polarization preparation, the SNR of radiation passed through segmented polarizer 112 is substantially maximized for a typical-defect radiation signal. In particular, according to some such embodiments, for each of polarizer segments 132, the SNR of radiation, passed through the polarizer segment, may be substantially maximized, so that, in consequence, the SNR of the (overall) radiation passed through segmented polarizer 112 is substantially maximized.

According to some embodiments, such as when the incident light beam $L_I$ is linearly polarized, some of the incident radiation scattered off unpatterned wafer 120 may be elliptical or slightly elliptical. This may hold both when the scattered radiation corresponds to pure background noise and when the scattered radiation corresponds to a typical-defect radiation signal. According to some such embodiments, waveplate 126 may be utilized to substantially "linearize" the elliptical radiation arriving thereat, and thereby ensure that linearly polarized radiation arrives at segmented polarizer 112. In this regard, it is noted that a waveplate does not function as a polarizing filter in the sense of not filtering out any of the radiation arriving thereat.

As the degree of ellipticity, of the collimated light beam, exiting relay optics 106, may vary in the lateral direction (i.e. along a plane perpendicular to optical axis A), waveplate 126 may be segmented. The segmentation may be such that each waveplate segment of waveplate 126 may be configured to modify by a different amount (i.e. to a different extent), respectively, the phase between the horizontal and vertical polarization components of the respective radiation arriving at the waveplate segment. The differential modification of the phase may be such that the light exiting each waveplate segment is substantially linearly polarized.

According to some embodiments, the segmentation of waveplate 126 may correspond to that of segmented polarizer 112. In particular, the dimensions of each of the waveplate segments may match the dimensions of a corresponding polarizer segment from polarizer segments 132. In each pair of corresponding waveplate segment and polarizer segment, the waveplate segment may be positioned substantially adjacently (from below) to the polarizer segment. In some embodiments, wherein optical mask 124 is included, optical mask 124 may be sandwiched between waveplate 126 and segmented polarizer 112, or waveplate 126 may be sandwiched between optical mask 124 and segmented polarizer.

Figure 2B:
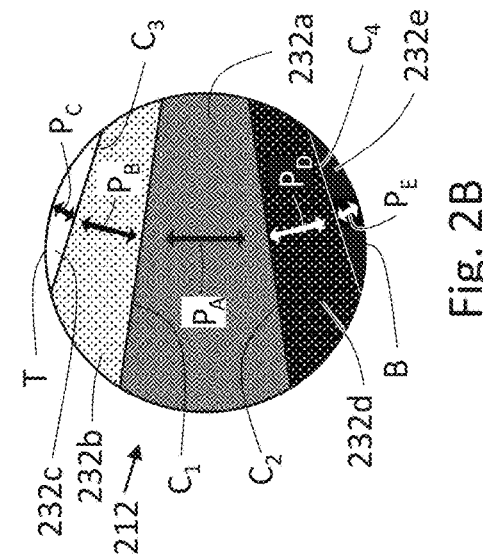
FIG. 2B presents a schematic bottom view of the segmented polarizer of FIG. 2A, according to some embodiments.
Figure 2D:
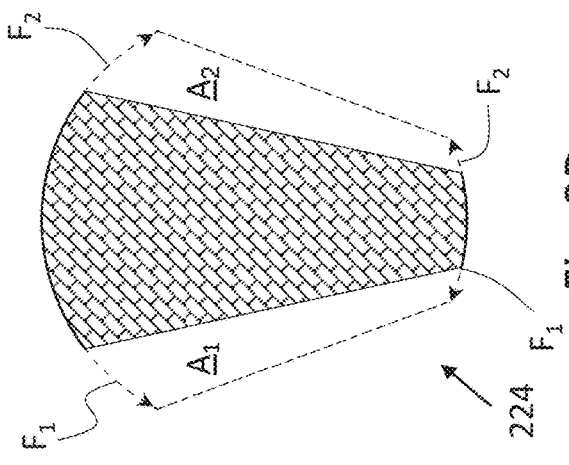
FIG. 2D schematically depicts the optical mask of FIG. 2A, according to some embodiments wherein the optical mask is adjustable.
Figure 2A:
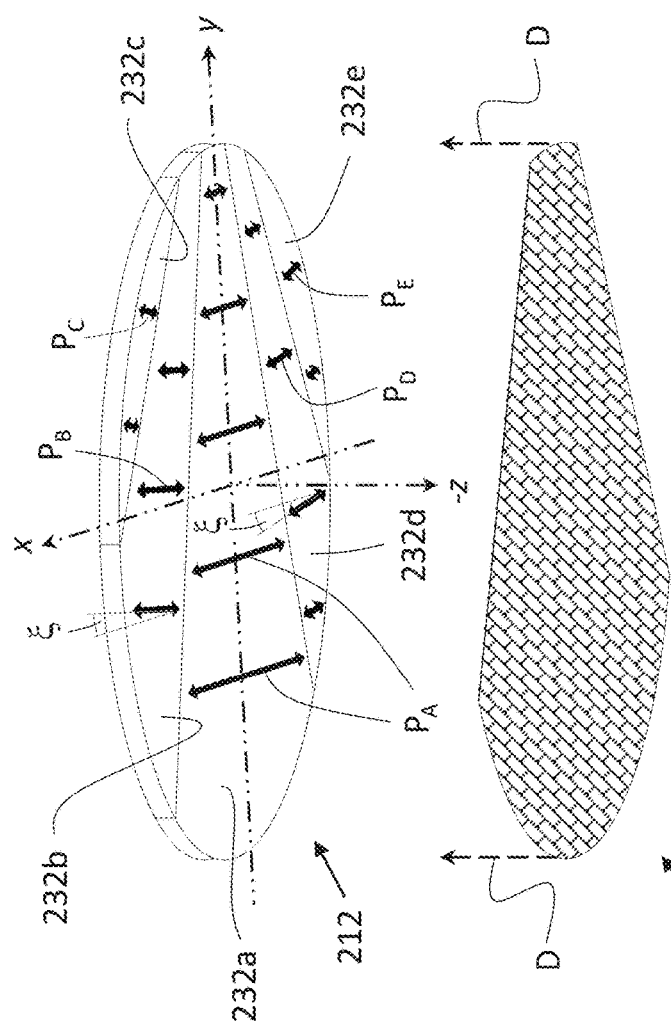
FIG. 2A schematically depicts a segmented polarizer, which is a specific embodiment of the segmented polarizer of FIG. 1A, and an optical mask configured for use therewith, according to some embodiments.

FIG. 2A presents a schematic, perspective bottom-view of a segmented polarizer 212, which is a specific embodiment of segmented polarizer 112. As a non-limiting example, in order to facilitate the description, segmented polarizer 212 is assumed to include five polarizer segments 232: a central segment 232a, a first side segment 232b, a second side segment 232c, a third side segment 232d, and a fourth side segment 232e. According to some embodiments, and as depicted in FIG. 2A, polarizer segments 232 may be complementary in the sense that the sum of areas thereof equals the area of segmented polarizer 212. Central segment 232a is positioned between first side segment 232b and third side segment 232d. First side segment 232b is positioned between second side segment 232c and central segment 232a. Third side segment 232d is positioned between central segment 232a and fourth side segment 232e.

FIG. 2B presents a schematic bottom view of segmented polarizer 212, according to some embodiments.

To further render the description more concrete, it is assumed that segmented polarizer 212 is configured to substantially minimize transmission therethrough of background noise due to the scattering of a p-polarized (incident) light beam off an unpatterned wafer. In particular, in embodiments of system 100 including segmented polarizer 212, illumination module 102 is configured to produce (or allow producing) a p-polarized incident light beam.

As mentioned in the Introduction, when linearly polarized light is incident on a defect-free region on an unpatterned wafer, the (collected) polarization scattering cross-section thereof exhibits substantially uniformly-aligned linear polarization over appreciable solid angles. Therefore, in order to establish the presence of a defect, scattered light arriving at such a solid angle may be subjected to a linear polarizer with a transmission axis, which is oriented perpendicularly to the mean (taken over the solid angle) polarization direction of the background noise.

Accordingly, and taking into account that, as mentioned in the Introduction, for incident p-polarization the scattering cross-section is symmetric about the incidence plane, central segment 232a is symmetric about the incidence plane. That is, the incidence plane bisects central segment 232a. Central segment 232a may be characterized by a polarization direction of ($\theta=90°$, $\varphi=0°$), wherein the first entry denotes the polar angle, as measured from the positive z-axis, and the second entry denotes the azimuth angle. That is, central segment 232a is configured to filter through light linearly polarized in parallel to the x-axis. The polarization direction is visualized in FIG. 2A by (double-headed) arrows $P_A$, which lie on the pupil plane in parallel to the x-axis. (It is to be understood that the lengths of the polarization arrows are not meant to signify anything.) Thus, along the y-axis, central segment 232a may be configured to fully filter out the y-component of the scattered radiation arriving thereat (i.e. light scattered along the incidence plane).

First side segment 232b and third side segment 232d display mirror symmetry about the incidence plane M. First side segment 232b is characterized by a polarization direction of ($\theta=90°$, $\varphi=\kappa>0°$). (Here, the angle $\varphi$ is defined as ranging clockwise from the positive x-axis to the positive y-axis.) Third side segment 232d is characterized by a polarization direction of ($\theta=90°$, $\varphi=-\kappa$), or, more precisely, and what amounts to the same thing ($\theta=90°$, $\varphi=360°-\kappa$). The respective polarization directions, characterizing first side segment 232b and third side segment 232d, are visualized in FIG. 2A by (double-headed) arrows $P_B$ and $P_D$, respectively, which lie on the pupil plane. Both the double-headed arrow $P_B$ and the x-axis, and the double-headed arrow $P_D$ and the x-axis, respectively, subtend there between an angle $\xi$ whose magnitude equals $\kappa$.

Second side segment 232c and fourth side segment 232e display mirror symmetry about the incidence plane M. Second side segment 232c is characterized by a polarization direction of ($\theta=90°$, $\varphi=\lambda>\kappa>0°$), and fourth side segment 232e is characterized by a polarization direction of ($\theta=90°$, $\varphi=-\lambda$). The respective polarization directions, characterizing second side segment 232c and fourth side segment 232e, are visualized in FIG. 2A by (double-headed) arrows $P_C$ and $P_E$, respectively, which lie on the pupil plane.

According to some embodiments, each of polarizer segments 232 is substantially shaped as a strip. More specifically, each of polarizer segments 232a, 232b, and 232d is positioned between two respective chords (i.e. straight lines between two points on the circumference of a circle) and respective arcs joining the chords. Referring to FIG. 2B, four chords are shown: a first chord $C_1$, a second chord $C_2$, a third chord $C_3$, and a fourth chord $C_4$. Central segment 232a extends between (i.e. is bounded by) the first chord $C_1$ and the third chord $C_3$, and a left arc (not numbered) and a right arc (not numbered) joining the chords, such as to fully circumscribe central segment 232a. According to some embodiments, the first chord $C_1$ and the third chord $C_3$ are symmetrically disposed (relative to one another) about the y-axis, thereby rendering the shape of central segment 232a mirror-symmetric about the y-axis.

First side segment 232b extends between the third chord $C_3$ and the first chord $C_1$ and a left arc (not numbered) and a right arc (not numbered) joining the chords, such as to fully circumscribe first side segment 232b. Third side segment 232d extends between the second chord $C_2$ and the fourth chord $C_4$, and a left arc (not numbered) and a right arc (not numbered) joining the chords, such as to fully circumscribe third side segment 232d. According to some embodiments, in addition to the first chord $C_1$ and the second chord $C_2$ being symmetrically disposed about the y-axis, the third chord $C_3$ and the fourth chord $C_4$ are also symmetrically disposed (relative to one another) about the y-axis, thereby rendering the shapes of first side segment 232b and third side segment 232d symmetric (relative to one another) about the y-axis.

Second side segment 232c extends between the third chord $C_3$ and a top arc T, which jointly fully circumscribe second side segment 232c. Fourth side segment 232e extends between the fourth chord $C_4$ and a bottom arc B, which jointly fully circumscribe fourth side segment 232e. The dimensions (shape and size) of second side segment 232c and fourth side 232e are thus symmetric (relative to one another) about the y-axis.

The polarization direction of each polarizer segment may be obtained by the aid of computer simulations, wherein the segmented polarizer (e.g. segmented polarizer 212) and the scattered radiation arriving thereat are modeled. According to some embodiments, in order to obtain the optimal polarization direction of a polarizer segment, the power of background noise radiation passed through the polarizer segment may be minimized over a continuous (or effectively continuous) set of polarization directions, which is known to include the optimal polarization direction, as explained below in the Methods subsection.

The optimal dimensions (sizes and shapes) of the polarizer segments (e.g. polarizer segments 232) may be obtained in a similar manner by minimizing the overall (total) power of the background noise radiation passed through the polarizer over continuous (or effectively continuous) sets of polarization directions pertaining to each of the polarizer segments and the dimensions of the polarizer segments.

In FIG. 2A, the depicted shapes of polarizer segments 232 exhibit what, based on simulations (presented in the Results of Simulations subsection), seems to be one of the main characterizing features of the optimal dimensions for p-polarized incident radiation, namely, the narrowing of each polarizer segment from left to right. More precisely, for an obliquely directed, and p-polarized, light beam incident from the left, as depicted in FIGS. 1A and 1B, substantially optimally, the polarizer segments may be shaped as strips which taper (decrease in width) as the y-coordinate increases.

Simulations suggest that this configuration is not restricted to the five-segment case, and may substantially hold also as the number of polarizer segments is increased beyond five segments. Intuitively, this may be attributed, at least in part, to the fact that—as shown in FIG. 11A—for background noise, for a given value of the y-coordinate, the change along the x direction in the polarization direction of the scattered radiation (i.e. from parallel to the x-axis to parallel to the y-axis) is more rapid, the greater the value of the y-coordinate. Thus, an accompanying increase in the "vertical" density of the polarizer segments (as the y-coordinate is increased) may be required—at least for optimal background noise suppression.

Also depicted in FIG. 2A is an optical mask 224, which is a specific embodiment of optical mask 124. As mentioned above, and as shown in the Results of Simulations subsection, according to some embodiments, to increase the SNR of a typical-defect radiation signal passed through a segmented polarizer, such as segmented polarizer 212, an optical mask, such as optical mask 224, may be employed to mask one or more regions on the segmented polarizer (so that the one or more regions are not irradiated by the scattered radiation). Optical mask 224 is configured to be positioned adjacently to segmented polarizer 212, as indicated by dashed arrows D.

To facilitate the description by way of an explicit example, optical mask 224 is assumed to be configured to fully prevent central segment 232a from being irradiated, and to partially prevent first side segment 232b and third side segment 232d from being irradiated. More specifically, optical mask 224 is assumed to be configured to prevent from being irradiated (i) a strip 252b (indicated in FIG. 2C) of first side segment 232b, adjacent to central segment 232a, and (ii) a strip 252d (indicated in FIG. 2C) of third side segment 232d, adjacent to central segment 232a.

Figure 2C:
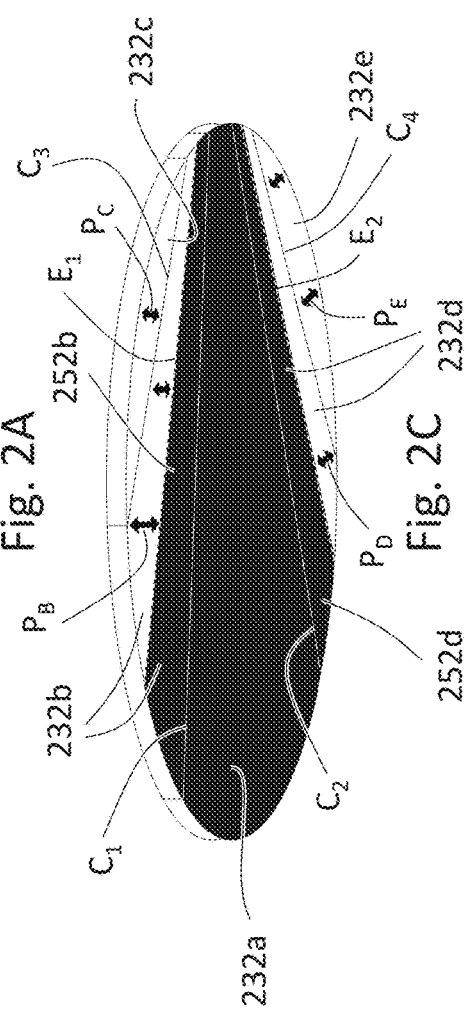
FIG. 2C schematically depicts the segmented polarizer of FIG. 2A and a region thereon that is "masked" by the optical mask of FIG. 2A, according to some embodiments.

FIG. 2C presents a schematic perspective bottom view of segmented polarizer 212, according to some embodiments. The region of segmented polarizer 212, masked by optical mask 224, is colored in black.

FIG. 2D presents a schematic bottom view of optical mask 224, according to some embodiments. According to some embodiments, optical mask 224 may be configured to allow changing the dimensions thereof and thereby changing the dimensions and/or location of the region of segmented polarizer 212 masked (blocked) by optical mask 224. By way of example, according to some embodiments, and as depicted in FIG. 2D, optical mask 224 may be configured to switch between contracted and expanded configurations, which resemble contracted and expanded configurations of a hand fan. Dashed arrows $F_1$ and dashed arrows $F_2$ serve to illustrate the expansion from a contracted configuration to an expanded configuration. In the contracted configuration, optical mask 224 is dimensioned as in FIG. 2A. In the expanded configuration, in comparison to the first configuration, optical mask 224 further extends over areas $A_1$ and $A_2$.

According to some embodiments, intermediate configurations between the contracted configuration and the expanded configuration may also be possible. Further, according to some embodiments, optical mask 224 may be contracted beyond the contracted configuration and/or expanded beyond the expanded configuration.

Figure 2E:
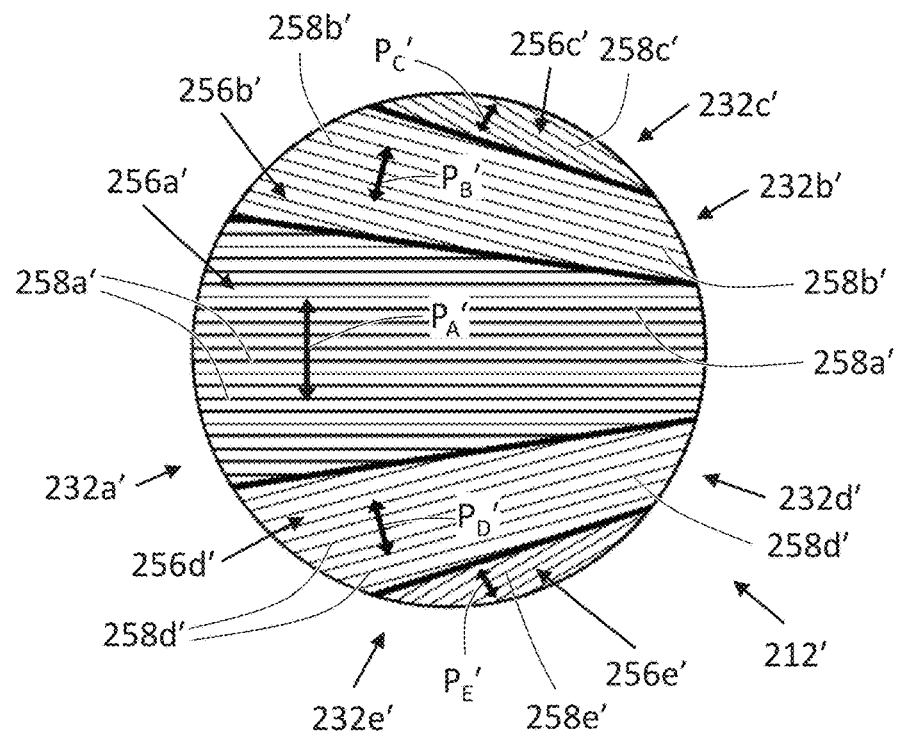
FIG. 2E schematically depicts a segmented polarizer, which is a specific embodiment of the segmented polarizer of FIG. 2A, wherein each polarizer segment is a wire-grid polarizer, according to some embodiments.

FIG. 2E schematically depicts a segmented polarizer 212', according to some embodiments. Segmented polarizer 212' is a specific embodiment of segmented polarizer 212, wherein each of the polarizer segments is a WGP. Segmented polarizer 212' includes a central segment 232a', a first side segment 232b', a second side segment 232c', a third side segment 232d', and a fourth side segment 232e', which are specific embodiments of central segment 232a, first side segment 232b, second side segment 232c, third side segment 232d, and fourth side segment 232e, respectively.

Each of polarizer segments 232' is formed of (i.e. constituted by) a respective WGP: Central segment 232a' is formed of a central WGP 256a', first side segment 232b' is formed of a first side WGP 256b', second side segment 232c' is formed of a second side WGP 256c', third side segment 232d' is formed of a third side WGP 256d', and fourth side segment 232e' is formed of a fourth side WGP 256e'. Central WGP 256a' includes a planar grid of parallel metallic wires 258a'.

As known in the art of WGPs, the orientation of the metallic wires in a WGP determines the polarization direction of the WGP, which is parallel to the planar grid, defined by the parallel metallic wires, and, at the same time, perpendicular to the metallic wires. The orientation of metallic wires 258a' is thus perpendicular to a polarization direction (indicated by a double-headed arrow $P_A'$) of central segment 232a'. Similarly, the orientations of metallic wires 258b' of first side WGP 256b', metallic wires 258c' of second side WGP 256c', metallic wires 258d' of third side WGP 256d', and metallic wires 258e' of fourth side WGP 256e' are perpendicular to the polarization directions of first side segment 232b', second side segment 232c', third side segment 232d', and fourth side segment 232e', respectively. The polarization directions of first side segment 232b', second side segment 232c', third side segment 232d', and fourth side segment 232e' are indicated by double-headed arrows $P_B'$, $P_C'$, $P_D'$, and $P_E'$, respectively.

While the structure of a segmented polarizer, including polarizer segments formed from respective WGPs, has been described explicitly in the five-segment case, as will be apparent to the skilled person, the generalization to four-segments, and, in particular, a number of segments greater than five, is straightforward.

Figure 3:
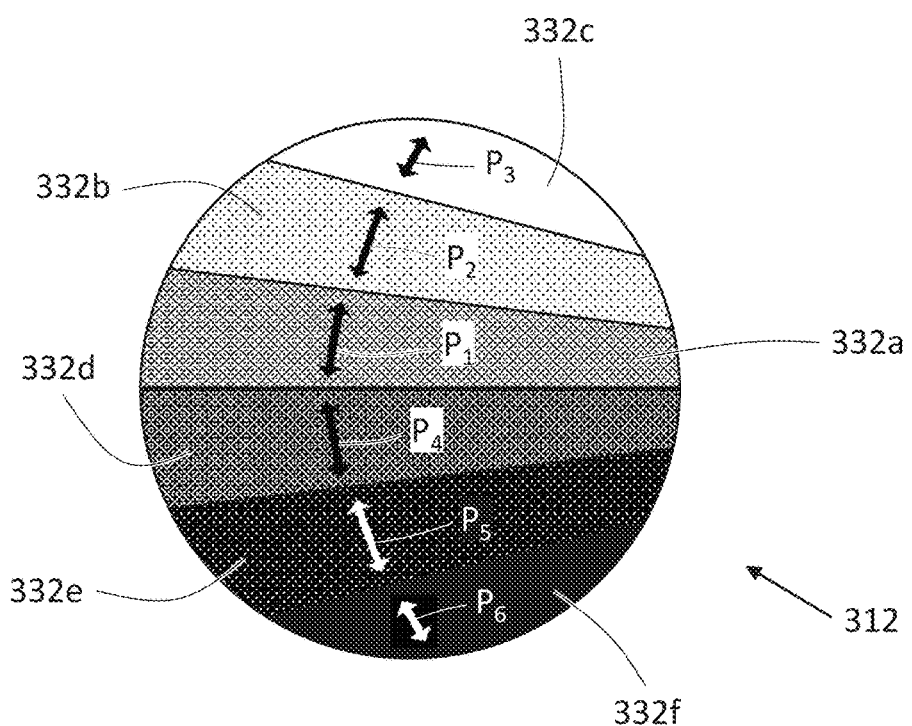
FIG. 3 schematically depicts a segmented polarizer, which is a specific embodiment of the segmented polarizer of FIG. 1A.

FIG. 3 schematically depicts a bottom view of a segmented polarizer 312, according to some embodiments. Segmented polarizer 312 is a specific embodiment of segmented polarizer 112. Segmented polarizer 312 includes six polarizer segments, and as such constitutes an example of a segmented polarizer which includes an even number of polarizer segments. Segmented polarizer 312 is configured to be utilized in conjunction with an obliquely directed, p-polarized incident radiation. More specifically, segmented polarizer includes a first central segment 332a, a first side segment 332b, a second side segment 332c, a second central segment 332d, a third side segment 332e, and a fourth side segment 332f. Segmented polarizer 312 exhibits mirror symmetry about the yz-plane (which corresponds to the incidence plane M in embodiments of system 100 including segmented polarizer 312): Second central segment 332d constitutes a mirror-image of first central segment 332a, third side segment 332e constitutes a mirror-image of first side segment 332b, and fourth side segment 332f constitutes a mirror-image of second side segment 332c.

Polarization directions of first central segment 332a, first side segment 332b, second side segment 332c, second central segment 332d, third side segment 332e, and fourth side segment 332f are indicated by double-headed arrows $P_1$, $P_2$, $P_3$, $P_4$, $P_5$, and $P_6$, respectively.

Figure 4A:
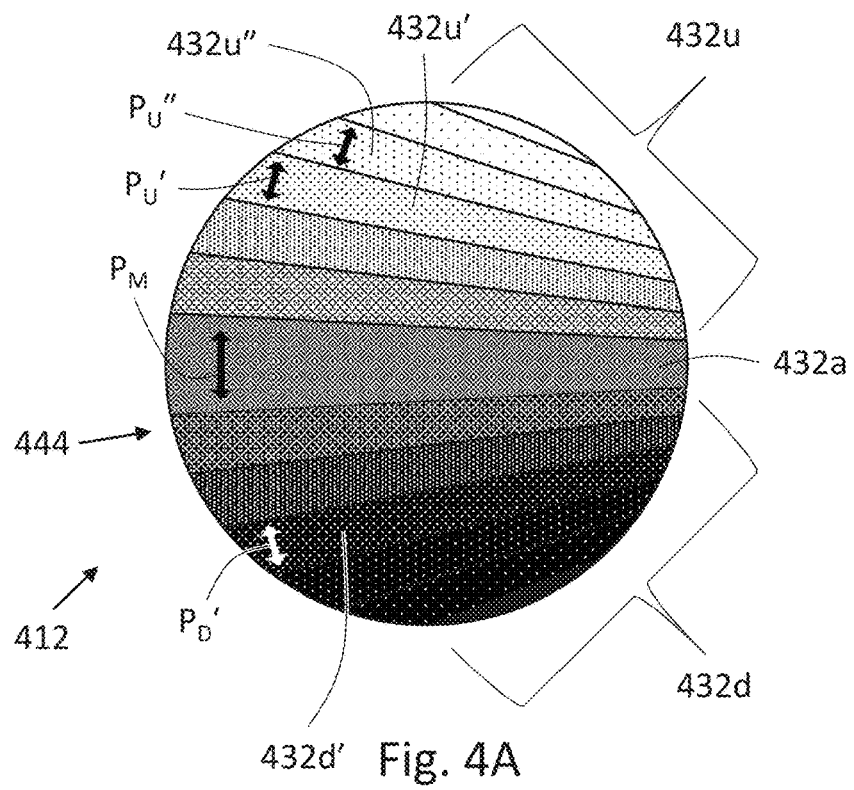
FIG. 4A schematically depicts a segmented polarizer, which is a specific embodiment of the segmented polarizer of FIG. 1A.

FIG. 4A presents a schematic bottom view of a segmented polarizer 412, according to some embodiments. Segmented polarizer 412 is a specific embodiment of segmented polarizer 112 and is configured to be used in conjunction with an obliquely directed, p-polarized incident radiation. Segmented polarizer 412 includes thirteen polarizer segments 432, not all of which are numbered. Segmented polarizer 412 exhibits mirror symmetry about the yz-plane (which corresponds to the incidence plane M in embodiments of system 100 including segmented polarizer 412). More specifically, polarizer segments 432 include a central segment 432a bordered from above and below by two chords (not numbered), respectively. The two chords are symmetrically disposed relative to one another about the y-axis. Also indicated, by a (double-headed) arrow $P_M$, is a polarization direction of central segment 432a, which is configured to filter through light polarized in parallel to the x-axis.

Polarizer segments 432 include six polarizer segments 432u positioned above central segment 432a and six polarizer segments 432d positioned below central segment 432a. To each of polarizer segments 432u corresponds a polarizer segment from polarizer segments 432d, which is a mirror image thereof, in the sense that each such pair of polarizer segments exhibits mirror symmetry about the y-axis, both in terms of dimensions and locations thereof, as well as in terms of the polarization directions thereof. For example, a polarizer segment 432u', from polarizer segments 432u, and a polarizer segment 432d', from polarizer segments 432d, are symmetrically disposed relative to one another about the y-axis. Further, a polarization direction (indicated by a double-headed arrow $P_U'$) of polarizer segment 432u' and a polarization direction (indicated by a double-headed arrow $P_D'$) of polarizer segment 432d' are mirror images of one another.

Also indicated is a polarizer segment 432u'', which is adjacent to polarizer segment 432u' from above, and a polarization direction (indicated by a double-headed arrow of $P_U''$) of polarizer segment 432u''. According to some embodiments, an absolute difference between the polarization angles of each two adjacent segments from polarizer segments 432—for example, polarizer segment 432u' and polarizer segment 432u''—is smaller than (i) an absolute deviation of a polarization angle of the scattered radiation through polarizer segment 432u', in the absence of a defect in the illumination area, and (ii) an absolute deviation of a polarization angle of the scattered radiation through polarizer segment 432u'', in the absence of a defect in the illumination area.

Figure 4B:
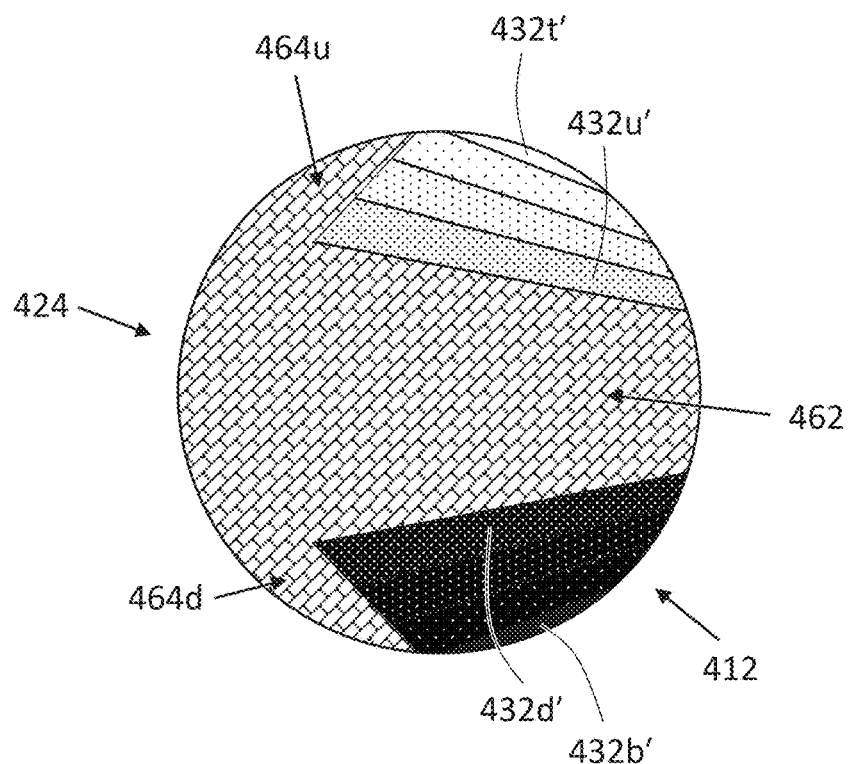
FIG. 4B schematically depicts the segmented polarizer of FIG. 4A and an optical mask configured for use therewith, according to some embodiments.

FIG. 4B presents a schematic bottom view of segmented polarizer 412 and an optical mask 424 disposed adjacently thereto, according to some embodiments. Unlike the embodiments of optical mask 224 depicted in FIGS. 2A and 2C, optical mask 424 is configured to effect a more complex masking pattern, which is not confined between two chords in the pupil. Since the vertical density of polarizer segments 432 increases with the y coordinate, along a left fringe 444 of segmented polarizer 412, the vertical density of polarizer segments 432 is minimum. Consequently, the filtering out of background noise radiation by left fringe 444 may be less effective as compared to the rest of segmented polarizer 412, particularly, when taking into account that the intensity of background noise radiation may be maximum along the left fringe of the pupil for a p-polarized light beam incident from the left. This last point is illustrated in FIG. 11B in the Results of Simulations subsection.

The masking pattern effected by optical mask 424 is configured to take into account—by fully masking left fringe 444 and not only a mid-portion thereof, as described below—the fact that the maximum intensity of the background noise is concentrated in the left fringe of the pupil.

More specifically, optical mask includes a main section 462, which is shaped similarly to optical mask 224, and two wedge-like portions extending from a left-end portion of main section 462: an upper wedge-like portion 464u and a lower wedge-like portion 464d. Optical mask 424 is shaped and dimensioned such that, when optical mask 424 is properly positioned adjacently to segmented polarizer 412, upper wedge-like portion 464u extends along an upper part of left fringe 444, and lower wedge-like portion 464d extends along a lower part of left fringe 444. Optical mask 424 is thus configured to block radiation arriving at substantially all of left fringe 444, thereby increasing the SNR.

As a non-limiting example, to render the description more concrete, in FIG. 4B, main section 462 is shown as fully masking all five polarizer segments between (and excluding) polarizer segments 432u' and 432d'. Upper wedge-like portion 464u partially blocks polarizer segment 432u', and the two polarizer segments immediately there above, but does not block a top polarizer segment 432t'. Lower wedge-like portion 464d partially blocks polarizer segment 432d', and the two polarizer segments immediately there below, but does not block a bottom polarizer segment 432b'.

Figure 5:
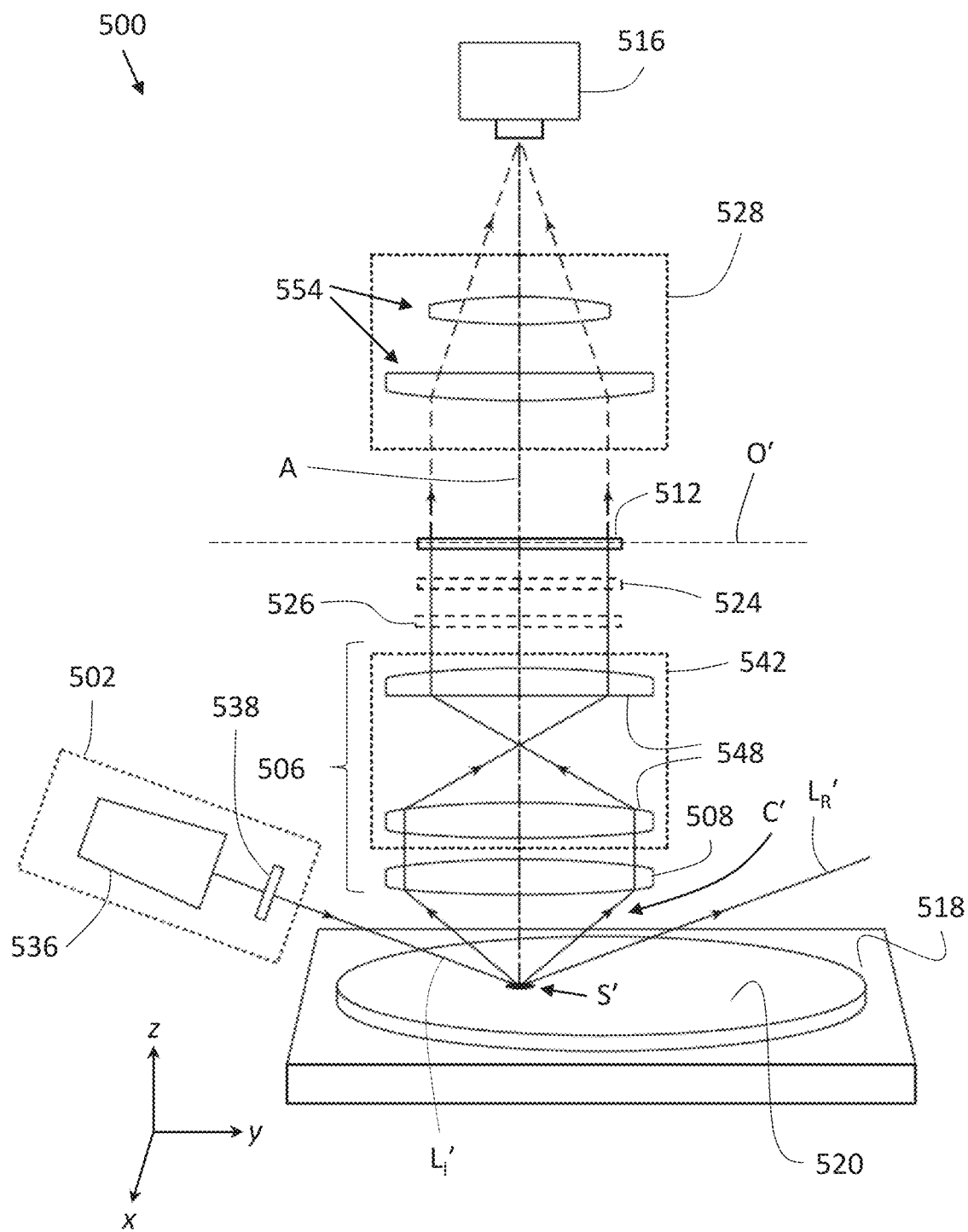
FIG. 5 schematically depicts a system for optical imaging of defects on unpatterned wafers, with an unpatterned wafer placed thereon, the system constituting a specific embodiment of the system of FIG. 1A.

FIG. 5 schematically depicts a system 500 for optical imaging of defects on unpatterned wafers, according to some embodiments. System 500 is a specific embodiment of system 100. System 500 includes an illumination module 502, relay optics 506, a segmented polarizer 512, and a detector 516, which are specific embodiments of illumination module 102, relay optics 106, segmented polarizer 112, and detector 116, respectively. System 500 may further include additional optics 528 configured to relay radiation filtered through segmented polarizer 512 to detector 516. According to some embodiments, system 500 may further include an optical mask 524 and/or a waveplate 526, which are a specific embodiment of optical mask 124 and waveplate 126, respectively. Also depicted are an unpatterned wafer 520, and a stage 518, which is a specific embodiment of stage 118.

According to some embodiments, imaging module 502 includes a light source 536 (a laser source), and optionally a polarizing element 538, such as a half-wave plate or a quarter-wave plate, configured to allow controllably selecting the polarization of an incident light beam $L_I'$ (e.g. laser beam) emitted by illumination module 502. According to some embodiments, polarizing element 538 may be, or include, a polarization filter. According to some such embodiments, the polarization filter may be controllably rotatable, such as to allow (i) controllably rotating the transmission axis thereof, and, thereby, (ii) selecting the polarization direction (e.g. p or s polarization) of the incident light beam $L_I'$.

Relay optics 506 includes an objective lens 508, which is a specific embodiment of objective lens 108, and additional optical components 542, positioned between objective lens 508 and segmented polarizer 512, or between objective lens 508 and optical mask 524 in embodiments including optical mask 524. Additional optical components 542 may include one or more additional lenses 548 configured to further focus the collimated light beam exiting objective lens 508 and prevent dispersion thereof (by re-collimating the light beam).

Additional optics 528 constitutes, or includes, a tube lens 554 configured to focus onto detector 516 light passed by segmented polarizer 512.

Also indicated in FIG. 5 are an optical axis A' and a pupil plane O' (along which segmented polarizer 512 may be set) of relay optics 506.

Figure 6:
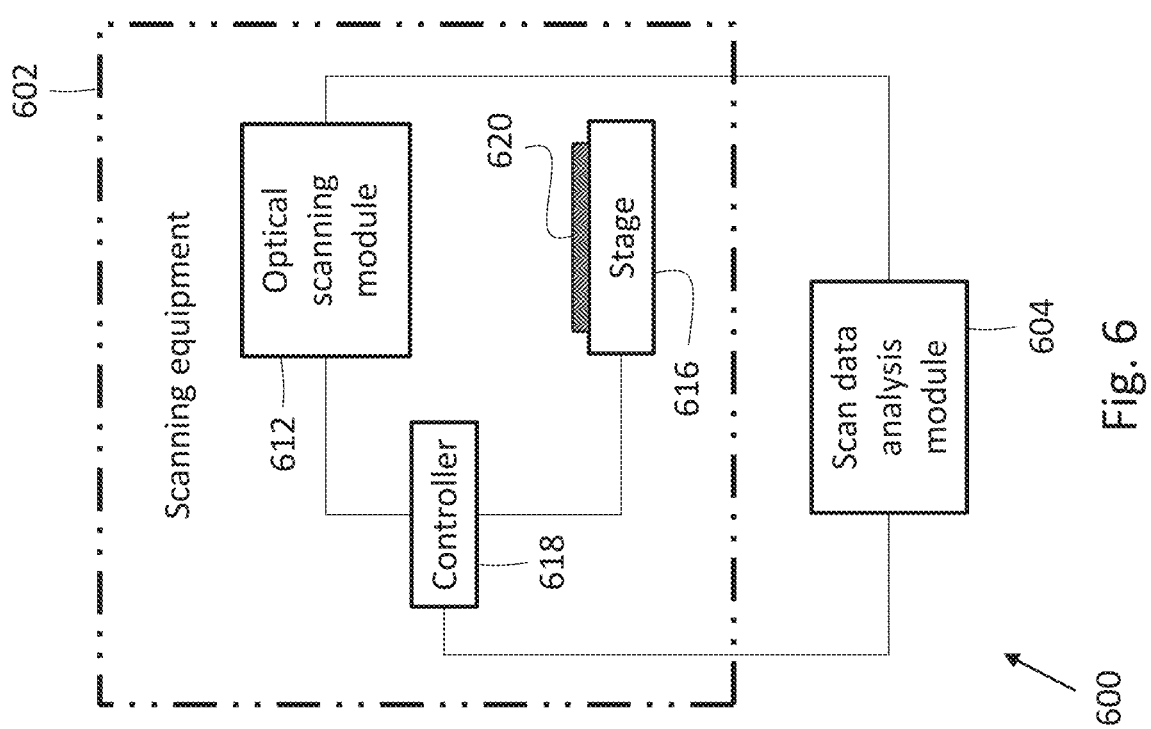
FIG. 6 is a block diagram of an optical-based system for unpatterned wafer inspection, which incorporates the optical system of FIG. 1A, according to some embodiments.

According to an aspect of some embodiments, there is provided an optical-based unpatterned wafer inspection system. FIG. 6 is a block diagram of such an unpatterned wafer inspection system, a system 600, according to some embodiments. System 600 includes scanning equipment 602 and a scan data analysis module 604. Scanning equipment 602 includes an optical scanning module 612, a stage 616, and a controller 618. Scanning equipment 602 is delineated by a dashed-double-dotted box to indicate that components therein (e.g. optical scanning module 612 and stage 616) may be separate from one another, e.g. in the sense of not being included in a common housing.

Optical scanning module 612 is similar to system 100. According to some embodiments, optical scanning module 612 is a specific embodiment of system 100. That is, in such embodiments, system 100 constitutes a subsystem of system 600.

Stage 616 is configured for placement thereon of a sample, such as an (unpatterned) wafer, which is to be inspected for the presence of defects. According to some embodiments, stage 616 may be moveable, as elaborated on below.

Controller 618 may be functionally associated with optical scanning module 612 and stage 616, as well as with scan data analysis module 604. More specifically, controller 618 is configured to control and synchronize operations and functions of the above-listed modules and components during a scan of an (unpatterned) wafer. For example, stage 616 may be configured to support an inspected sample, such as an unpatterned wafer 620, and to mechanically translate the inspected sample along a trajectory set by controller 618, which also controls optical scanning module 612.

Scan data of an unpatterned wafer, obtained by scanning equipment 602, may be relayed to scan data analysis module 604. Scan data analysis module 604 is configured to detect defects (if present) on the unpatterned wafer, based on the obtained scan data (relayed thereto). Scan data analysis module 604 includes computer hardware (one or more processors, such as image and/or graphics processor units, and volatile as well as non-volatile memory components; not shown). The computer hardware is configured to analyze the scan data (obtained by optical scanning module 612), of a region on unpatterned wafer 620, for presence of defects in the region, as known in the art of optical inspection of unpatterned wafers.

According to some embodiments, optical scanning module 612 includes an optical mask, which can be switched between different configurations having different dimensions (e.g. shape and/or size), essentially as described above with respect to optical mask 224. According to some such embodiments, scan data analysis module 604 may be configured to determine an optimal configuration for the optical mask and instruct controller 618 to switch the optical mask to the optimal configuration.

The optimal configuration of the optical mask may be determined based on previously obtained scan data, for example, from previously scanned unpatterned wafers from the same batch.

Figure 7:
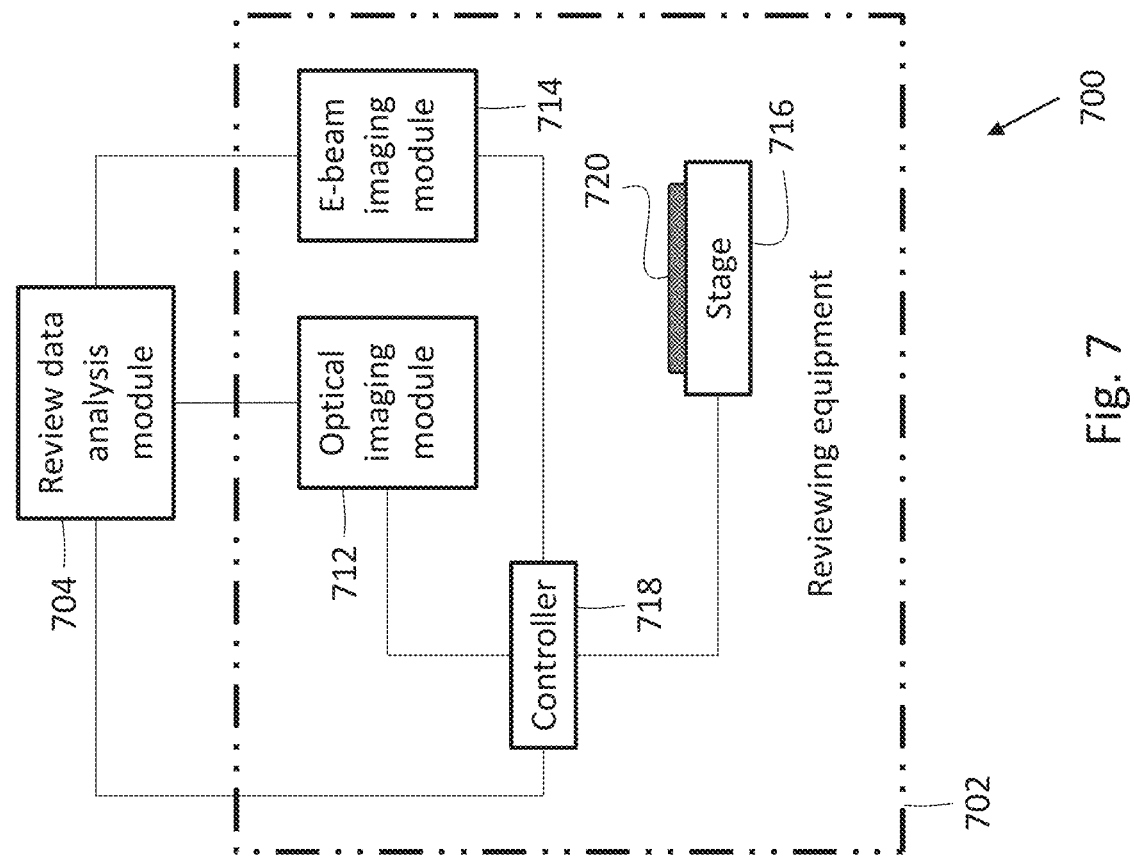
FIG. 7 presents a block diagram of an e-beam based system for reviewing defects on unpatterned wafers, which incorporates the optical system of FIG. 1A, according to some embodiments.

According to an aspect of some embodiments, there is provided a system for unpatterned wafer defect review (that is, review of defects on unpatterned wafers). FIG. 7 is a block diagram of such an unpatterned wafer inspection system, a system 700, according to some embodiments. System 700 includes reviewing equipment 702 and a review data analysis module 704. Reviewing equipment 702 includes an optical imaging module 712, an e-beam imaging module 714, a stage 716, and a controller 718. Reviewing equipment 702 is delineated by a dashed-double-dotted box to indicate that components therein (e.g. optical imaging module 712 and stage 716) may be separate from one another, e.g. in the sense of not being included in a common housing.

Optical imaging module 712 is similar to system 100. According to some embodiments, optical imaging module 712 is a specific embodiment of system 100. That is, in such embodiments, system 100 constitutes a subsystem of system 700.

Stage 716 is configured for placement thereon of a previously inspected (unpatterned) wafer 720, which is to be reviewed. According to some embodiments, stage 716 may be moveable, as elaborated on below.

Controller 718 may be functionally associated with optical imaging module 712, e-beam imaging module 714, and stage 716, as well as with review data analysis module 704. More specifically, controller 718 is configured to control and synchronize operations and functions of the above-listed modules and components during a review of an (unpatterned) wafer. For example, stage 716 may be configured to support a reviewed sample, such as unpatterned wafer 720, and to mechanically translate the reviewed sample, according to instructions received from controller 718, such as to allow optical imaging module 712 and/or e-beam imaging module 714 to image one or more defects in a received or obtained defects map (i.e. a map specifying coordinates of defects on an (unpatterned) wafer).

Review data analysis module 704 is configured to receive images, obtained by optical imaging module 712, of defects on an unpatterned wafer. The defects may be specified in a defects map, which specifies coordinates of each of the defects. The defects map may be received from an unpatterned wafer inspection system. Review data analysis module 704 includes computer hardware (one or more processors, such as image and/or graphics processor units, and volatile as well as non-volatile memory components; not shown). Based on the received images, the computer hardware is configured to redetect the defects, and thereby correct the defects map. The corrected defects map may be sent to controller 718. Controller 718 is configured to translate stage 716, according to the corrected defects map, such as to allow e-beam imaging module 714 to obtain higher resolution images of each of the defects in the (corrected) defects map.

Review data analysis module 704 is further configured to receive the higher resolution images obtained by e-beam imaging module 714 of the (e-beam imaged) defects. The computer hardware (in review data analysis module 704) may further be configured to classify the defects, based on the received higher resolution images thereof, as known in the art of SEM-based review of defects on unpatterned wafers.

Methods

According to an aspect of some embodiments, there is provided a method for increasing SNR in optical imaging of defects on unpatterned wafers. FIG. 8 presents a flowchart of such a method 800, according to some embodiments. Method 800 may be implemented utilizing a system for optical imaging of defects on unpatterned wafers, such as system 100, according to some embodiments thereof, and systems similar thereto. Method 800 includes:

An operation 810 of irradiating a region of an unpatterned wafer with a substantially polarized, incident light beam (e.g. incident light beam $L_I$).

An operation 820 of employing relay optics (e.g. relay optics 106) to collect and guide, radiation scattered off the region (e.g. off illumination area S), onto a segmented polarizer (e.g. segmented polarizer 112) including at least four polarizer segments (e.g. polarizer segments 132) characterized by respective polarization angles.

For each polarizer segment, of the at least four polarization segments, a respective polarization angle (polarization direction) thereof may be such that, when the region includes a typical defect, a SNR of scattered radiation transmitted (i.e. passed) through the polarizer segment is substantially maximized. Additionally, according to some embodiments, the dimensions of the at least four polarizer segments are such that, when the region includes a typical defect, a SNR of scattered radiation transmitted through (all of) the at least four polarizer segments is substantially maximized.

Additionally, or alternatively, for each polarizer segment, of the at least four polarization segments, the respective polarization angle thereof may be such that, in the absence of a defect in the region, a power of scattered radiation transmitted through the polarizer segment is substantially minimized. In particular, the respective polarization angle of each of the polarizer segments may be substantially orthogonal to the mean polarization of respective background noise radiation, arriving at the polarization segment (the background noise radiation having been generated in the scattering of the (polarized) incident light beam from the region). The mean polarization of radiation incident on a region (e.g. a polarizer segment) may be obtained by taking the spatial average, across the region, of the polarization. Additionally, according to some embodiments, the dimensions of the at least four polarizer segments are such that, in the absence of a defect in the region, an (overall) power of scattered radiation transmitted through (all of) the at least four polarizer segments is substantially minimized.

According to some embodiments, an absolute difference between polarization angles of each two adjacent segments (from the at least four polarizer segments) is smaller than (i) an absolute deviation of a polarization angle of background noise radiation, and (ii) an absolute deviation of a polarization angle of background noise radiation.

According to some embodiments, the at least four polarizer segments are substantially complementary in the sense of substantially fully encompassing the segmented polarizer. That is, in such embodiments, the at least four polarizer segments substantially account for the totality of the segmented polarizer.

Alternatively, according to some embodiments, the at least four polarizer segments are non-complementary. According to some such embodiments, the segmented polarizer includes one or more opaque sections.

According to some embodiments, each of the at least four polarizer segments is a wire-grid polarizer.

According to some embodiments, in operation 810, the incident light beam may be irradiated at a non-zero angle with respect to an optical axis (e.g. the optical axis A), defined by the relay optics. In particular, the (non-zero) angle may be such that a (specularly) reflected light beam (e.g. reflected light beam $L_R$) is not collected by the relay optics. According to some embodiments, the (non-zero)

angle may be greater than about 10°, about 15°, about 20°, about 30°, about 40°, about 55°, or about 75°. Each possibility corresponds to separate embodiments. According to some embodiments, the incident light beam is obliquely directed (i.e. $\theta_I$>0, as shown, for example, in FIGS. 1A, 1B, and 5). It is noted that in embodiments wherein the optical axis is normal (perpendicular) to the (irradiated) unpatterned wafer (as depicted in FIG. 1A, for example), the non-zero angle is given by the incidence angle of the incident light beam $L_I$. However, it will be understood that other options are possible. In particular, according to some embodiments, the optical axis is normal to the unpatterned wafer. According to some such embodiments, the angle of incidence is substantially equal to 0°.

According to some embodiments, the incident light beam may be substantially linearly polarized. The choice of polarization is dependent on the context. Incident p-polarization may be more suitable for detecting small defects, as typically the defect will scatter more (and accordingly reflect less) of incident p-polarization as compared to incident s-polarization. In contrast, s-polarization may be more suitable for rougher surfaces (and, therefore, larger defects).

According to some embodiments, the segmented polarizer is substantially set on a pupil of the relay optics. According to some such embodiments, the optical axis, defined by the relay optics, lies substantially on an incidence plane (e.g. the incidence plane M) of the incident light beam.

According to some embodiments, the incident light beam is substantially p-polarized or s-polarized. Accordingly, the segmented polarizer is configured such as to substantially displays mirror symmetry about the incidence plane of the incident light beam (as exhibited, for example, by segmented polarizers 212, 212', 312, and 412, which, according to some embodiments are configured to substantially maximize the SNR, and/or substantially minimize transmission of background noise, when utilized in conjunction with p-polarized incident radiation).

According to some embodiments, method 800 further includes an operation 805 wherein an optical mask (e.g. optical mask 124) is utilized to mask one or more regions on the segmented polarizer from the scattered radiation. The masking may allow increasing the SNR (as compared to when the mask is not utilized). Alternatively, as explained above in the Systems subsection, the increase SNR may be obtained by a segmented polarizer including one or more opaque section(s). According to some embodiments, the optical mask may be adjustable (e.g. as depicted in FIG. 2D), such as to allow selecting, and/or adjusting the dimensions of the one or more regions which are to be masked.

According to some embodiments, wherein method 800 includes operation 805, the dimensions and polarization angles of each of the at least four polarizer segments, and the dimensions of the optical mask and the positioning thereof relative to the segmented polarizer, are such that the SNR of scattered radiation, passed through the at least four polarizer segments, is substantially maximized when a typical defect is present in the region.

According to some embodiments, operation 820 further includes utilizing a waveplate (e.g. waveplate 126), positioned between the segmented polarizer and the relay optics, to substantially linearize the scattered radiation arriving at the segmented polarizer. According to some embodiments, different portions of the scattered radiation, differing from one another by respective retardation between vertical polarization components and horizontal polarization components thereof, may be addressed on a portion-by-portion by utilizing a segmented waveplate. That is, in such embodiments, the waveplate includes a plurality of waveplate segments, each waveplate segment being configured to alter by a different amount, respectively, the phase between the vertical polarization component and the horizontal polarization component of radiation arriving at the waveplate segment.

According to an aspect of some embodiments, there is provided a computerized method for optical inspection of unpatterned wafers. The method may be implemented utilizing system 600 or a system similar thereto, which includes system 100. According to some embodiments, the method includes:

Implementing method 800 with respect to an unpatterned wafer.

Employing at least one detector (e.g. detector 116) to sense scattered radiation passed through the segmented polarizer (e.g. segmented polarizer 112), thereby obtaining image data of the unpatterned wafer.

Analyzing the obtained image data (e.g. using scan data analysis module 604) to detect defects on the unpatterned wafer.

According to an aspect of some embodiments, there is provided a computerized method for unpatterned wafer defect review. The method may be implemented utilizing system 700 or a system similar thereto which includes system 100. The method includes an optical-based stage and an e-beam based stage. According to some embodiments, the optical-based stage includes:

Receiving an unpatterned wafer including one or more detected defects and a defects map specifying coordinates of the one or more detected defects.

Generating a corrected defects map by, for each of the one or more detected defects:

Implementing method 800 with respect to a region (on the unpatterned wafer) including the detected defect.

Forming an image of the detected defect from scattered radiation passed through the segmented polarizer (e.g. segmented polarizer 112).

Analyzing the formed image (e.g. using review data analysis module 704) to correct, if necessary, the coordinates of the detected defect.

According to some embodiments, the e-beam based stage includes:

Employing a SEM (e.g. included in e-beam imaging module 714) to review the one or more defects, based on the corrected defects map.

Reviewing (e.g. using review data analysis module 704) SEM-obtained images of the one or more defects.

According to an aspect of some embodiments, there is provided a method for manufacturing a n≥4 segmented polarizer, such as segmented polarizer 112 according to some embodiments thereof. The manufactured segmented polarizer is configured for increasing SNR in optical imaging of defects on unpatterned wafers. FIG. 9 presents a flowchart of such a method 900, according to some embodiments. Method 900 includes:

An operation 910 wherein scattering data of a polarized light beam—incident on a region, of an unpatterned wafer, including a typical defect—is obtained. The scattering data is indicative of a spatial dependence of the scattering cross-section (of the scattered radiation) across a pupil plane, whereon the segmented polarizer is to be set.

An operation 920, wherein, based on the scattering data, substantially optimal dimensions and polarization angles of the n polarizer segments are computed. The substantially optimal dimensions and polarization angles of the n polarizer segments may be obtained using software to simulate the segmented polarizer and the scattered light (scattered from the region including the typical defect) arriving thereat. The simulation may then be utilized to maximize, over the n dimensions and polarization angles, a SNR of the scattered radiation, which may be passed through the n polarizer segments.

An operation 930, wherein the segmented polarizer is manufactured in accordance with the obtained substantially optimal dimensions and polarization angles.

According to an aspect of some embodiments, there is provided a method 1000 for manufacturing a n≥4 segmented polarizer, such as segmented polarizer 112 according to some embodiments thereof. The manufactured segmented polarizer is configured for suppressing background noise in optical imaging of defects on unpatterned wafers. FIG. 10 presents a flow chart of such a method 1000, according to some embodiments. Method 1000 includes:

An operation 1010 wherein scattering data of a polarized light beam, incident on a defect-free region of an unpatterned wafer, is obtained. The scattering data is indicative of a spatial dependence of the scattering cross-section (of the scattered radiation) across a pupil plane, whereon the segmented polarizer is to be set.

An operation 1020, wherein, based on the scattering data, substantially optimal dimensions and polarization angles of the n polarizer segments are computed. The substantially optimal dimensions and polarization angles of the n polarizer segments may be obtained using software to simulate the segmented polarizer and the scattered light (scattered from the defect-free region) arriving thereat. The simulation may then be utilized to minimize, over the n dimensions and polarization angles, a power of the scattered radiation which may be passed through the n polarizer segments.

An operation 1030, wherein the segmented polarizer is manufactured in accordance with the obtained substantially optimal dimensions and polarization angles.

Results of Simulations

This subsection presents results of computer simulations, which demonstrate the utility of the systems and methods disclosed herein. System 100 was simulated (i.e. modeled by software), according to some embodiments thereof. The simulations depict distributions of intensity and polarization direction—across the pupil plane—of light "scattered" by (simulated) system 100 in the absence and in the presence of a typical defect in an illuminated area on an unpatterned wafer. In particular, the simulation results provide an indication of how the background noise suppression, and the SNR of filtered radiation, are expected to increase with the number of polarizer segments.

Each of FIGS. 11A and 11B depicts the distribution of polarization direction and intensity, respectively, across the pupil plane for pure background noise in the absence of filtering (i.e. when no polarizer was employed to filter the light arriving at the pupil). Each of FIGS. 11C and 11D depicts the distribution of polarization direction and intensity, respectively, across the pupil plane for a radiation signal associated with a typical (three-dimensional) defect in the absence of filtering. Referring to FIGS. 11A and 11C, green represents polarization parallel to the x-axis, while red represents polarization parallel to they-axis. Referring to FIGS. 11B and 11D, a two-color scale is used to represent the intensity: Dark-blue corresponds to (minimum) zero intensity while bright yellow corresponds to maximum intensity (so that the midsection of the scale is in green, ranging from bluish-green to yellowish-green). It is noted that the maximum intensity of pure background noise is concentrated about a left fringe $F_L$ of the pupil. In contrast, the maximum intensity of a typical-defect radiation signal is concentrated about a right half $H_R$ of the circumference of the pupil.

A same (cartesian) coordinate system is used throughout FIGS. 11A-11D to (spatially) parametrize the pupil. It is noted that the coordinate system is the same as that used in FIG. 2A to parameterize segmented polarizer 212.

Each of the intensity distributions depicted in FIGS. 12A-12E, 13A-13E, 14A-14E, and 15A-15E was obtained under different simulation settings, respectively. The different simulation settings differ from one another in one or more of: the simulated segmented polarizer utilized (if at all), whether an optical mask was employed (and, if so, the dimensions thereof), the numerical aperture (NA) of the simulated relay optics, and whether a defect was present or absent in the illumination area. In particular, different segmented polarizers (corresponding to different embodiments of segmented polarizer 112) were simulated, differing from one another in the number of polarizer segments, the dimensions thereof, and/or the polarization directions thereof. Otherwise, the simulation settings were similar. In particular, the same wavelength, the same incidence angle, and the same incidence polarization—i.e. p-polarization—were "employed" throughout.

It is noted that the simulation results of FIGS. 12A-12E, 13A-13E, 14A-14E, and 15A-15E are not the product of an optimization algorithm and as such are not strictly optimized. Instead, simulation settings, which are expected to provide results not far from optimal, were selected. As such, the obtained simulation results, are expected to be broadly reflective or at least provide an indication of the interrelation between different controllably selectable simulation parameters, such as the number of segments, the inclusion of masking, and the size of the NA.

Referring to FIGS. 12A-12F, the simulations were performed at NA=0.5 and without masking (and with the polarizer segments of each segmented polarizer constituting substantially all of the segmented polarizer). FIG. 12A shows the distribution of intensity across the pupil for pure background noise (top) and in the presence of a typical defect in the illumination area (bottom), in the unfiltered case (i.e. when the scattered light arriving at the pupil is not filtered). A multi-color scale, depicted in FIG. 12F, was employed to represent the intensity. It is to be understood that in each of the intensity distributions depicted, the maximum intensity (although always colored in dark red) corresponds to a different value. In other words, the scaling of the intensity scale varies from one intensity distribution to another. In particular, the top end of the scale of an intensity distribution, obtained in the absence of a polarizer (i.e. without filtering, as in the bottom row of FIG. 12A, for example), may be significantly larger than that of an intensity distribution obtained utilizing a polarizer (i.e. with filtering, as in the bottom row of FIG. 12C, for example).

FIGS. 12B, 12C, 12D, and 12E show the distribution of intensity across the pupil for pure background noise (top) and a typical-defect radiation signal (middle), in the case of a uniform polarizer, a three-segment polarizer, a five-segment polarizer, and a semi-continuous polarizer. The uniform polarizer is depicted at the bottom of FIG. 12B, the three-segment polarizer is depicted at the bottom of FIG. 12C, the five-segment polarizer is depicted at the bottom of FIG. 12D, and the semi-continuous polarizer is depicted at the bottom of FIG. 12E.

The respective dimensions of the polarizer segments of the simulated segmented polarizers (FIGS. 12C to 12E, bottom) are indicated by varying shades of blue and red. In the case of an odd number of polarizer segments (as in FIGS. 12C and 12D), the central segment is colored blue. Side segments above the central segment are colored in increasingly lighter shades of blue. Side segments below the central segment are colored in increasingly lighter shades of red. In the case of even number of polarizer segments (as in FIGS. 12C and 12E). Polarizer segments on the top half of the segmented polarizer are colored in increasingly lighter shades of blue. Polarizer segments on the bottom half of the segmented polarizer are colored in increasingly lighter shades of red.

The respective dimensions and polarization directions (not specified) of the polarizer segments of each of the segmented polarizers were selected to jointly exhibit mirror-symmetry about they-axis, reflecting the mirror-symmetry about they-axis of the polarization direction and intensity distributions of pure background noise and a typical-defect radiation signal. In particular, the polarization direction of the uniform polarizer was set parallel to the x-axis, as were the polarization directions of the central segments of the three-segment and five-segment polarizers, respectively.

14A-14E the NA was set to 0.95. The simulation results are presented in a similar layout to that of FIGS. 12A-12E, as summarized in Table 1 below. Further, the multi-color scale of FIG. 12F is also used to quantify the intensity in each of the simulations of FIGS. 13A-13E, 14A-14E, and 15A-15E. To facilitate the perusal of the figures, the multi-color scale of FIG. 12F is reproduced in each of FIGS. 13F, 14F, and 15F.

The respective dimensions of the polarizer segments of the simulated segmented polarizers of FIGS. 13C-13E, 14C-14E, and 15C-15E are indicated by varying shades of blue and red. A central region of the segmented polarizer, which is masked, is colored in dark blue, and is, moreover, delineated (delimited) by a dashed-dotted line. Side segments above the central segment are colored in increasingly lighter shades of blue. Side segments below the central segment are colored in increasingly lighter shades of red.

In each of FIGS. 13C-13E, 14C-14E, and 15C-15E, the polarization directions of the side segments above the central segments are rotated clockwise from the x-axis, while the polarization directions of the side segments below the central segments are rotated counterclockwise from the x-axis, essentially as depicted in FIGS. 2A, 2B, 3, and 4A.

TABLE 1

| presentation format of FIGS. 13A-13E, 14A-14E, and 15A-15E | | | | | |
|---|---|---|---|---|---|
| | No filtering | Uniform polarizer | "Two-segment" polarizer | "Four-segment" polarizer | Semi-continuous polarizer |
| Pure background noise | FIGS. 13A, 14A, and 15A - top | FIGS. 13B, 14B, and 15B - top | FIGS. 13C, 14C, and 15C - top | FIGS. 13D, 14D, and 15D - top | FIGS. 13E, 14E, and 15E - top |
| Typical-defect radiation signal | FIGS. 13A, 14A, and 15A - bottom | FIGS. 13B, 14B, and 15B - middle | FIGS. 13C, 14C, and 15C - middle | FIGS. 13D, 14D, and 15D - middle | FIGS. 13E, 14E, and 15E - middle |
| Polarizer dimensions | | FIGS. 13B, 14B, and 15B - bottom | FIGS. 13C, 14C, and 15C - bottom | FIGS. 13D, 14D, and 15D - bottom | FIGS. 13E, 14E, and 15E - bottom |

(The semi-continuous polarizer included an even number of polarizer segments.) The polarization directions of the side segments above the central segments are rotated clockwise from the x-axis, while the polarization directions of the side segments below the central segments are rotated counter-clockwise from the x-axis, essentially as depicted in FIGS. 2A, 2B, 3, and 4A.

In contrast to the multi-segment polarizers, the power of the radiation filtered through uniform polarizer did not reach threshold detection. The SNR of the radiation filtered through the three-segment polarizer (in the absence of any masking) is taken as the baseline, onto which all other SNRs are compared. The SNR of the radiation through the five-segment polarizer is greater by a factor of approximately 1.9 than the SNR of the radiation filtered through the three-segment polarizer. The SNR of the radiation through the semi-continuous polarizer is greater by factors of approximately 14.4 and 27.2 than the SNRs of the radiations filtered through the five-segment polarizer and the three-segment polarizer, respectively.

In contrast to the simulation settings of FIGS. 12A-12E, in the simulation settings of FIGS. 13A-13E, 14A-14E, and 15A-15E an optical mask was "employed" to further increase the SNR. In FIGS. 13A-13E the NA was set to 0.5, in FIGS. 14A-14E the NA was set to 0.7, and in FIGS.

Before proceeding with the presentation of the simulation results, it is noted that "masking" may also be achieved by employing a segmented polarizer, which includes an opaque section extending over what would otherwise (i.e. in embodiments wherein the segmented polarizer does not include an opaque section) constitute the masked region. As mentioned above, in each of FIGS. 13C-13E (bottom), 14C-14E (bottom), and 15C-15E (bottom), the masked region is delineated by a (white) dashed-dotted line.

To obtain an estimate of the increase in the SNR, which may be provided by masking, or by employing a segmented polarizer including an opaque section, the simulation results of FIGS. 13A-13F may be compared to those FIGS. 12A-12F. Regions on the polarizer, whereto a typical-defect radiation signal is not scattered, may be masked. In this regard, it is noted that, for the three-segment polarizer (of FIG. 12C), a substantially maximum increase in the SNR may be obtained by fully masking a central region of the segmented polarizer, such that the central region includes in full the central segment. The masking effectively transforms the three-segment polarizer into a two-segment polarizer. Accordingly, the SNR, which is obtained when employing the two-segment polarizer (of FIG. 13C), is compared to the SNR, which is obtained when employing the three-segment polarizer (FIG. 12C, bottom). The blocking of the central region from transmitting radiation therethrough (whether by employing an optical mask or by the inclusion of an opaque section in a segmented polarizer), advantageously improves the SNR by a factor of approximately 2.9.

Referring to FIG. 13D, it is noted that a four-segment polarizer (as depicted in FIG. 13D, bottom) may in principle be obtained from a five-segment polarizer (as depicted in FIG. 12D, bottom) by masking a central region of the five-segment polarizer, such that the central region includes in full the central segment. Accordingly, the SNR, which is obtained when employing the four-segment polarizer (FIG. 13D, bottom) is compared to the SNR, which is obtained when employing the five-segment polarizer (FIG. 12D, bottom). The blocking of the central region advantageously improves the SNR by a factor of approximately 2.9 (again).

Finally, the SNR, which is obtained when employing the semi-continuous polarizer of FIG. 13E, is compared to the SNR, which is obtained when employing the semi-continuous polarizer of FIG. 12E. The blocking of the central region advantageously improves the SNR by a factor of approximately 1.5.

Higher SNRs may be obtained as the NA is increased. To obtain an estimate of the increase the simulation results of FIGS. 14A-14F, and FIGS. 15A-15F, may be compared to those FIGS. 13A-13F. Referring first to FIGS. 14A-14F, as compared the simulations settings of FIGS. 13A-13F, the NA was increased by 40% (i.e. from NA=0.5 to NA=0.7). In the two-segment case (FIG. 13C and FIG. 14C), this led to an increase by a factor of approximately 1.5 in the SNR. In the four-segment case (FIG. 13D and FIG. 14D), this led to an increase by a factor of approximately 1.4 in the SNR. Finally, in the semi-continuous case (FIG. 13E and FIG. 14E), this led to an increase by a factor of approximately 1.1 in the SNR.

Referring to FIGS. 15A-15F, as compared the simulations settings of FIGS. 13A-13F, the NA was increased by 95% (i.e. from NA=0.5 to NA=0.95). In the two-segment case (FIG. 13C and FIG. 15C), this led to an increase by a factor of approximately 2.7 in the SNR. In the four-segment case (FIG. 13D and FIG. 15D), this led to an increase by a factor of approximately 1.9 in the SNR. Finally, in the semi-continuous case (FIG. 13E and FIG. 15E), this led to an increase by a factor of approximately 1.3 in the SNR.

The systems and methods, disclosed herein thus far, are reliant on the use of a segmented polarizer to individually address on a portion-by-portion basis different portions of a scattered light beam collected and guided, using relay optics, onto the segmented polarizer. More specifically, different polarizer segments are characterized by different polarization angles such as to substantially maximize a SNR of a typical-defect radiation signal (generated in the scattering of linearly polarized light off an unpatterned wafer).

However, it is to be understood that the addressing on a portion-by-portion basis of the scattered light beam may also be achieved using other configurations of optical components. In particular, instead of employing a segmented polarizer, a uniform (linear) polarizer may be employed together with a segmented polarization rotator (or a plurality of polarization rotators), which is positioned between the relay optics and the uniform polarizer. Each of the rotator segments (or polarization rotators when a plurality of polarization rotators is included) may be configured (and positioned) to rotate the polarization angle of a respective portion of the scattered light beam, arriving thereat, by a respective amount. The degree (amount) of rotation may be selected such that an angle between the adjusted (i.e. output) polarization direction of the respective portion of the scattered light beam and the polarization direction of the uniform polarizer matches the angle between the polarization direction of the same portion, when not subjected to polarization rotation, and the polarization direction of the respective segmented polarizer. In this manner, substantially the same suppression of background noise and increase in SNR—as in the embodiments described above including a segmented polarizer—may, in principle, be achieved by utilizing a segmented polarization rotator (or a plurality of polarization rotators) instead of a segmented polarizer.

More generally, it will be understood that a segmented polarizer and a segmented polarization rotator may be employed in conjunction to achieve substantially the same suppression of background noise and increase in SNR as in the embodiments described above including a segmented polarizer. In this regard, it is noted that a segmented polarizer configured to be utilized together with a segmented polarization rotator, will likely lead to sub-optimal results when utilized without the segmented polarization rotator. Similarly, a segmented polarization rotator configured to be utilized together with a segmented polarizer, will likely lead to sub-optimal results when utilized with a uniform polarizer.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. No feature described in the context of an embodiment is to be considered an essential feature of that embodiment, unless explicitly specified as such.

Although operations/stages of methods according to some embodiments may be described in a specific sequence, methods of the disclosure may include some or all of the described operations/stages carried out in a different order. A method of the disclosure may include a few of the operations/stages described or all of the operations described. No particular operation/stage in a disclosed method is to be considered an essential operation of that method, unless explicitly specified as such.

As used herein, in the context of a method, the term "stage" may refer to one or more operations of the method.

Although the disclosure is described in conjunction with specific embodiments thereof, it is evident that numerous alternatives, modifications and variations that are apparent to those skilled in the art may exist. Accordingly, the disclosure embraces all such alternatives, modifications and variations that fall within the scope of the appended claims. It is to be understood that the disclosure is not necessarily limited in its application to the details of construction and the arrangement of the components and/or methods set forth herein. Other embodiments may be practiced, and an embodiment may be carried out in various ways.

The phraseology and terminology employed herein are for descriptive purpose and should not be regarded as limiting. Citation or identification of any reference in this application shall not be construed as an admission that such reference is available as prior art to the disclosure. Section headings are used herein to ease understanding of the specification and should not be construed as necessarily limiting.

What is claimed is:

1. A system for optical imaging of defects on unpatterned wafers, the system comprising:
   a stage;

an illumination module configured to produce a substantially polarized light beam incident on a selectable region of an unpatterned wafer;

a segmented polarizer comprising at least four polarizer segments characterized by respective dimensions and polarization directions;

relay optics configured to collect and guide, radiation scattered off the unpatterned wafer onto the segmented polarizer; and a detector configured to sense scattered radiation passed through the segmented polarizer; and wherein the respective dimensions and polarization direction of each of the at least four polarizer segments are such that, when the illuminated selectable region comprises a defect, a signal-to-noise ratio (SNR) of radiation, scattered off the illuminated selectable region and passed through the at least four polarizer segments, is substantially maximized and the respective polarization direction of each of the polarizer segments is substantially perpendicular to a mean polarization direction of respective background noise radiation, generated in the scattering of the incident light beam from the region and arriving at the respective polarizer segment.

2. The system of claim 1 wherein the at least four polarizer segments are non-complementary, and the segmented polarizer comprises one or more opaque sections; and/or wherein the system further comprises an optical mask configured to prevent one or more regions on the segmented polarizer from being exposed to radiation scattered off an unpatterned wafer irradiated by the illumination module, and thereby increase an overall SNR of scattered radiation passed through the segmented polarizer, and wherein each of at least four, of the at least four polarizer segments, is configured to have at least a part thereof exposed to the scattered radiation.

3. The system of claim 1 wherein the illumination module is configured to produce the substantially polarized light beam at a non-zero angle with respect to an optical axis, defined by the relay optics, and wherein the substantially polarized light beam, produced by the illumination module, is substantially linearly polarized.

4. The system of claim 3 wherein the segmented polarizer is substantially set on a pupil of the relay optics, wherein an optical axis, defined by the relay optics, lies substantially on an incidence plane of the polarized light beam, produced by the illumination module, wherein the illumination module is configured to produce the polarized light beam such as to be substantially p-polarized or s-polarized, and wherein the at least four polarizer segments substantially jointly exhibit mirror symmetry about an incidence plane of the polarized light beam.

5. The system of claim 4 further comprising a wave plate, positioned between the segmented polarizer and the relay optics, the wave plate being configured to modify the polarization properties of scattered radiation arriving at the segmented polarizer, and wherein, optionally, the wave plate comprises a plurality of wave plate segments, each wave plate segment being configured to modify to a different extent, respectively, a phase between a vertical polarization component and a horizontal polarization component of scattered radiation arriving at the waveplate segment.

6. The system of claim 1 wherein each of the at least four polarizer segments is a wire-grid polarizer.

7. The system of claim 1 wherein the at least four polarizer segments are arranged in one or more groups of adjacently disposed strips, and wherein for each two adjacent segments, from the at least four polarizer segments, an absolute difference between polarization angles, defined by the respective polarization directions, of the two adjacent segments is smaller than an absolute deviation of a polarization angle of the background noise radiation arriving at a first segment from the two adjacent segments, and (ii) an absolute deviation of a polarization angle of the background noise radiation arriving at a second segment from the two adjacent segments.

8. A method for optical imaging of defects on unpatterned wafers, the method comprising:

irradiating a region of an unpatterned wafer with a substantially polarized, incident light beam; and employing relay optics to collect and guide, radiation scattered off the region, onto a segmented polarizer comprising at least four polarizer segments;

wherein respective dimensions and polarization direction of the at least four polarizer segments are such that, when the region comprises a typical defect, a SNR of radiation, scattered off the illuminated selectable region and passed through the at least four polarizer segments, is substantially maximized and the respective polarization direction of each of the polarizer segments is substantially perpendicular to a mean polarization direction of respective background noise radiation, generated in the scattering of the incident light beam from the region and arriving at the respective polarizer segment.

9. The method of claim 8 wherein the at least four polarizer segments are non-complementary, and wherein, optionally, the segmented polarizer comprises one or more opaque sections.

10. The method of claim 8 further comprising utilizing an optical mask to prevent one or more regions on the segmented polarizer from being irradiated by the scattered radiation, such as to increase a total SNR of scattered radiation passed through the segmented polarizer, and wherein, optionally, the one or more regions on the segmented polarizer comprise one or more additional polarizer segments which are distinct from the at least four polarizer segments.

11. The method of claim 8 wherein the incident light beam defines a non-zero angle with respect to an optical axis, defined by the relay optics, wherein the segmented polarizer is substantially set on a pupil of the relay optics, and wherein the incident light beam is substantially linearly polarized.

12. The method of claim 11 wherein an optical axis, defined by the relay optics, lies substantially on an incidence plane of the incident light beam, wherein the incident light beam is substantially p-polarized or s-polarized, and wherein the at least four polarizer segments substantially jointly exhibit mirror symmetry about an incidence plane of the incident light beam.

13. The method of claim 8 wherein the at least four polarizer segments are arranged in one or more groups of adjacently disposed strips, and wherein for each two adjacent segments, from the at least four polarizer segments, an absolute difference between polarization angles, defined by the respective polarization directions, of the two adjacent segments is smaller than (i) an absolute deviation of a polarization angle of the background noise radiation arriving at a first segment from the two adjacent segments, and (ii) an absolute deviation of a polarization angle of the background noise radiation arriving at a second segment from the two adjacent segments.

14. A method for reviewing defects on an unpatterned wafer with an evaluation tool that comprises an optical-based stage and a scanning electron microscope (SEM) based stage, the method comprising:

receiving an unpatterned wafer comprising one or more detected defects and a defect map specifying coordinates of the one or more detected defects; and for each of the one or more detected defects:

optically reviewing the defect by irradiating a region comprising the defect with a substantially polarized, incident light beam;

employing relay optics to collect and guide, radiation scattered off the region, onto a segmented polarizer comprising at least four polarizer segments, wherein respective dimensions and polarization direction of each of the at least four polarizer segments are such that, when the region comprises a defect, a SNR of radiation, scattered off the illuminated selectable region and passed through the at least four polarizer segments, is substantially maximized and the respective polarization direction of each of the polarizer segments is substantially perpendicular to a mean polarization direction of respective background noise radiation, generated in the scattering of the incident light beam from the region and arriving at the respective polarizer segment;

forming an image of the detected defect from scattered radiation passed through the segmented polarizer; and analyzing the formed image to correct, if necessary, the coordinates of the detected defect thereby generating a corrected defect map;

employing the SEM based stage to generate SEM images of the one or more defects, based on the corrected defect map; and reviewing the SEM images of the one or more defects.

15. A system for optical imaging of defects on unpatterned wafers, the system comprising an illumination module, relay optics, a segmented polarizer, and a detector;

wherein the illumination module is configured to produce a substantially polarized light beam incident on a selectable region of an unpatterned wafer at a non-zero angle with respect to an optical axis, defined by the relay optics, and wherein the substantially polarized light beam, produced by the illumination module, is substantially linearly polarized;

wherein the relay optics is configured to collect and guide, radiation scattered off the unpatterned wafer, onto the segmented polarizer;

wherein the detector is configured to sense scattered radiation passed through the segmented polarizer;

wherein the segmented polarizer comprises at least four polarizer segments characterized by respective dimensions and polarization directions such that an overall power of background noise radiation, generated in the scattering of the incident light beam from the illuminated selectable region and passed through the at least four polarizer segments, is decreased as compared to when utilizing a linear polarizer; and wherein (i) the segmented polarizer comprises one or more opaque regions such that the at least four polarizer segments are non-complementary, and/or (ii) the system further comprises an optical mask configured to prevent one or more regions on the segmented polarizer from being exposed to the radiation scattered off an unpatterned wafer, with each of at least four, of the at least four polarizer segments, being configured to have at least a part thereof exposed to the scattered radiation, and thereby increase a SNR of scattered radiation passed through the segmented polarizer, when the illuminated selectable region comprises a typical defect and wherein the respective polarization direction of each of the polarizer segments is substantially perpendicular to a mean polarization direction of respective background noise radiation, generated in the scattering of the incident light beam from the region and arriving at the respective polarizer segment.

16. The system of claim 15, wherein the segmented polarizer is substantially set on a pupil of the relay optics, wherein an optical axis, defined by the relay optics, lies substantially on an incidence plane of the polarized light beam, produced by the illumination module, wherein the illumination module is configured to produce the polarized light beam such as to be substantially p-polarized or s-polarized, and wherein the at least four polarizer segments substantially jointly exhibit mirror symmetry about an incidence plane of the polarized light beam.

17. The system of claim 15, wherein each of the at least four polarizer segments is a wire-grid polarizer.

18. The system of claim 15, wherein the at least four polarizer segments are arranged in one or more groups of adjacently disposed strips, and wherein for each two adjacent segments, from the at least four polarizer segments, an absolute difference between polarization angles, defined by the respective polarization directions, of the two adjacent segments is smaller than an absolute deviation of a polarization angle of the background noise radiation arriving at a first segment from the two adjacent segments, and (ii) an absolute deviation of a polarization angle of the background noise radiation arriving at a second segment from the two adjacent segments.

* * * * *